United States Patent [19]

Kaida

[11] Patent Number: 5,701,048
[45] Date of Patent: *Dec. 23, 1997

[54] CHIP-TYPE PIEZOELECTRIC RESONANCE COMPONENT

[75] Inventor: Hiroaki Kaida, Nagaokakyo, Japan

[73] Assignee: Murata Manufacturing Co., Ltd., Japan

[ * ] Notice: The term of this patent shall not extend beyond the expiration date of Pat. No. 5,442,251.

[21] Appl. No.: 506,262

[22] Filed: Jul. 24, 1995

Related U.S. Application Data

[63] Continuation of Ser. No. 248,343, May 24, 1994, abandoned.

[30] Foreign Application Priority Data

| May 31, 1993 | [JP] | Japan | 5-128770 |
| Sep. 28, 1993 | [JP] | Japan | 5-241746 |
| Oct. 21, 1993 | [JP] | Japan | 5-263769 |

[51] Int. Cl.$^6$ .................................. H01L 41/08
[52] U.S. Cl. .................. 310/321; 310/326; 310/348; 310/367
[58] Field of Search .................. 310/320, 321, 310/326, 338, 344, 346, 367

[56] References Cited

U.S. PATENT DOCUMENTS

| 2,231,483 | 2/1941 | Smalts | 310/361 |
| 2,443,471 | 6/1948 | Mason | 310/326 |
| 3,185,943 | 5/1965 | Honda et al. | 333/72 |

(List continued on next page.)

FOREIGN PATENT DOCUMENTS

| 0496583 | 1/1928 | European Pat. Off. | H03H 9/19 |
| 0496583 | 1/1992 | European Pat. Off. | H03H 9/19 |
| 2547458 | 2/1984 | France | 310/346 |
| 2547458 | 12/1984 | France | 310/346 |

(List continued on next page.)

OTHER PUBLICATIONS

Co-pending U.S. Patent Application No. 08/458,171 PN 5,541,467.
Co-pending U.S. Patent Application No. 08/506,262.
Co-pending U.S. Patent Application No. 08/287,530.
Co-pending U.S. Patent Application No. 08/443,783.
Co-pending U.S. Patent Application No. 08/444,831.
Co-pending U.S. Patent Application No. 08/292,244.
Co-pending U.S. Patent Application No. 08/426,689.
Co-pending U.S. Patent Application No. 08/423,466.
Co-pending U.S. Patent Application No. 08/524,052.
Transducers & Their Elements: Design & Application, Alexander D. Khazan "Strain-gage Elements," p. 41.
Inoue et al., "First and Second Order Group Timing Tank Ceramic Filters for PCM Carriers Systems," Japanese Journal of Applied Physics, vol. 20, 1981, Supplement 20-4, pp.101-104.
Co-pending U.S. Patent Application No. 08/452,516 now U.S. Pat. No. 5,627,425.
Co-pending U.S. Patent Application No. 08/458,171 now U.S. Pat. No. 5,541,467.
J.P Den Hartog, "Mechanical Vibrations", pp. 87-93, Dover Publications, Inc. New York, 1985.

(List continued on next page.)

Primary Examiner—Thomas M. Dougherty
Attorney, Agent, or Firm—Ostrolenk, Faber, Gerb & Soffen, LLP

[57] ABSTRACT

A chip-type piezoelectric resonance component is prepared by bonding spacer plates to side portions of an energy trap piezoelectric resonator. The resonator includes a piezoelectric resonance unit coupled with dynamic dampers vibrating for suppressing vibration as it is propagated, with the vibration being suppressed through a phenomenon of the dynamic dampers. Case members are pasted onto upper and lower portions of an element plate through sheet-type adhesives which define spaces for allowing vibration and prevent vibration of the vibrating portions from being hindered.

22 Claims, 20 Drawing Sheets

5,701,048
Page 2

U.S. PATENT DOCUMENTS

| | | | |
|---|---|---|---|
| 3,411,023 | 11/1968 | Quate et al. | 310/328 |
| 3,488,530 | 1/1970 | Staudte | 310/367 |
| 3,723,920 | 3/1973 | Sheahan et al. | 333/92 |
| 3,745,385 | 7/1973 | Nakajima | 310/333 |
| 4,101,795 | 7/1978 | Fukomoto et al. | 310/336 |
| 4,104,553 | 8/1978 | Engdahl et al. | 310/352 |
| 4,287,493 | 9/1981 | Masaie | 333/191 |
| 4,323,865 | 4/1982 | Tanaka et al. | 333/187 |
| 4,348,609 | 9/1982 | Inoue et al. | 310/367 |
| 4,350,918 | 9/1982 | Sato | 310/367 |
| 4,355,257 | 10/1982 | Kawashima | 310/361 |
| 4,356,421 | 10/1982 | Shimizu et al. | 310/320 |
| 4,360,754 | 11/1982 | Toyoshima et al. | 310/366 |
| 4,365,181 | 12/1982 | Yamamoto | 310/320 |
| 4,443,728 | 4/1984 | Kudo | 310/348 |
| 4,447,753 | 5/1984 | Ochiai | 310/312 |
| 4,454,444 | 6/1984 | Fujiwara et al. | 310/360 |
| 4,462,092 | 7/1984 | Kawabuchi et al. | 310/336 |
| 4,484,382 | 11/1984 | Kawashima | 29/25.35 |
| 4,511,202 | 4/1985 | Kasai | 310/321 |
| 4,555,682 | 11/1985 | Gounji et al. | 333/189 |
| 4,562,372 | 12/1985 | Nakamura et al. | 310/321 |
| 4,564,825 | 1/1986 | Takahashi et al. | 310/333 |
| 4,571,794 | 2/1986 | Nakamura | 29/25.35 |
| 4,609,844 | 9/1986 | Nakamura | 310/321 |
| 4,757,581 | 7/1988 | Yamada et al. | 310/348 |
| 4,900,971 | 2/1990 | Kawashima | 310/367 |
| 5,001,383 | 3/1991 | Kawashima | 310/367 |
| 5,006,824 | 4/1991 | Paff | 333/197 |
| 5,059,853 | 10/1991 | Kawashima | 310/367 |
| 5,107,164 | 4/1992 | Kimura | 310/367 |
| 5,117,147 | 5/1992 | Yuoshida | 310/320 |
| 5,118,980 | 6/1992 | Takahashi | 310/320 |
| 5,159,301 | 10/1992 | Kaida et al. | 333/187 |
| 5,192,925 | 3/1993 | Kaida | 310/367 |
| 5,202,652 | 4/1993 | Tabuchi et al. | 319/313 R |
| 5,218,260 | 6/1993 | Kawashima | 310/348 |
| 5,260,675 | 11/1993 | Ogawa et al. | 310/348 |
| 5,274,297 | 12/1993 | Hermann | 310/361 |
| 5,302,880 | 4/1994 | Kaida | 310/370 |
| 5,341,550 | 8/1994 | Kaida | 29/25.35 |
| 5,361,045 | 11/1994 | Beaussier et al. | 310/348 |
| 5,394,123 | 2/1995 | Inoue et al. | 310/348 |
| 5,422,532 | 6/1995 | Inoue et al. | 310/326 |
| 5,442,251 | 8/1995 | Kaida et al. | 310/321 |
| 5,495,135 | 2/1996 | Zimnicki et al. | 310/312 |

FOREIGN PATENT DOCUMENTS

| | | | |
|---|---|---|---|
| 0365268 | 4/1990 | France | 310/367 |
| 2939844 | 7/1980 | Germany | H03H 9/19 |
| 3220032 | 12/1982 | Germany | H03H 9/05 |
| 4321949 | 1/1994 | Germany | B06B 1/06 |
| 0049013 | 4/1980 | Japan | 310/346 |
| 55-52621 | 4/1980 | Japan | 310/368 |
| 55-64414 | 5/1980 | Japan | H03H 9/10 |
| 57-48818 | 3/1982 | Japan | 310/344 |
| 2117968 | 3/1983 | Japan | H03H 9/10 |
| 60-137113 | 7/1985 | Japan | H03H 9/05 |
| 61-154211 | 7/1986 | Japan | H03H 9/17 |
| 0187907 | 8/1988 | Japan | H03H 9/17 |
| 63-260310 | 10/1988 | Japan | 310/367 |
| 63-260311 | 10/1988 | Japan | 310/367 |
| 63-311810 | 12/1988 | Japan | 310/367 |
| 1-180109 | 7/1989 | Japan | H03H 9/02 |
| 5791016 | 7/1989 | Japan | H03H 9/17 |
| 0275213 | 3/1990 | Japan | 310/367 |
| 0279509 | 3/1990 | Japan | H03H 9/19 |
| 0279510 | 3/1990 | Japan | H03H 9/19 |
| 0279511 | 3/1990 | Japan | 310/367 |
| 3226106 | 10/1991 | Japan | H03H 9/19 |
| 0575372 | 3/1993 | Japan | H03A 9/05 |
| 0661775 | 3/1994 | Japan | H03H 9/17 |
| 6164307 | 6/1994 | Japan | B01D 21/30 |
| 1358596 | 6/1970 | United Kingdom | H03H 9/14 |
| 2004434 | 3/1979 | United Kingdom | H03H 9/26 |
| 2043995 | 10/1979 | United Kingdom | H03H 9/09 |
| 2043995 | 10/1980 | United Kingdom | H03H 9/09 |
| 2102199 | 5/1982 | United Kingdom | H03H 9/03 |
| 2117968 | 10/1983 | United Kingdom | 310/367 |
| 2213013 | 8/1989 | United Kingdom | H03H 9/10 |
| 2224159 | 4/1990 | United Kingdom | H03H 9/19 |
| 2277196 | 10/1994 | United Kingdom | H03H 9/09 |
| 2277228 | 10/1994 | United Kingdom | H04R 17/10 |
| 2278721 | 12/1994 | United Kingdom | H03H 5/05 |
| 9216997 | 10/1992 | WIPO | H03H 9/58 |

OTHER PUBLICATIONS

Osamu Taniguchi, "Vibration Engineering", pp. 113–116, Corona Publishing Co., Ltd. with English language translation.

UK Search Report dated Jul. 14, 1994.

J. Ormondroyd & J.P. Hartog, "The Theory of the Dynamic Vibration Absorber", pp.9–22, Transactions of the American Society of Mechanical Engineers, APM–50–7.

CHIP-TYPE PIEZOELECTRIC RESONANCE COMPONENT

This is a Continuation of application Ser. No. 08/248,343 filed on May 24, 1994 now abandoned.

BACKGROUND OF THE INVENTION

1. Field of the Invention

The present invention relates to a chip-type piezoelectric resonance component which is suitably surface-mounted on a substrate, for example, and more particularly, it relates to a chip-type piezoelectric resonance component which traps vibrational energy in a piezoelectric resonator through a phenomenon of a dynamic damper.

2. Description of the Background Art

In general, a resonator utilizing an expansion vibration mode of a rectangular piezoelectric plate, a resonator utilizing a length mode vibration of a rod type piezoelectric body, or a tuning fork type piezoelectric resonator is employed as a piezoelectric resonator for a kHz band.

When a piezoelectric resonator whose resonance part vibrates by application of a voltage is formed as an actual component, it is necessary to support the resonator so as to not hinder its resonance. In an energy trap piezoelectric resonator, vibrational energy is trapped in a resonance part of the resonator and hence, it is possible to mechanically hold the energy in a region other than the resonance part. Due to its superiority in application to a product, therefore, such an energy trap resonator is also used as to a piezoelectric resonator for a kHz band.

In a resonator utilizing an expansion vibration mode or a length vibration mode which is known as a general kHz band piezoelectric resonator, however, it is impossible to trap vibrational energy. As shown in FIG. 1A, therefore, a conventional piezoelectric resonator 91 utilizing a length vibration mode is held by spring terminals 92 and 93 holding vibration nodal points. Also in a rectangular piezoelectric resonator utilizing an expansion vibration mode which cannot trap vibrational energy, its nodal points are held by spring terminals. Therefore, such a piezo-resonator utilizing an expansion vibration mode or a length vibration mode of a kHz band is so complicated in component structure that it is extremely difficult to form the piezoelectric resonator as a surface-mountable miniature chip-type component.

As shown in FIG. 1B, on the other hand, vibrational energy is trapped in vibrating parts of a tuning fork type piezoelectric resonator 96 comprising a piezoelectric plate 94 which is polarized along its thickness, slits 94a to 94c which are formed in the piezoelectric plate 94 and vibrating electrodes 95a which are formed on both major surfaces of the piezoelectric plate 94 around the central slit 94b (the vibration electrode provided on the lower side is not shown in FIG. 1B). Therefore, the tuning fork type piezoelectric resonator 96 can be formed as a surface-mountable chip component since its characteristics remain unchanged also when the same is held in portions around edges 94d and 94e of the piezoelectric plate 94, for example.

In the tuning fork type piezoelectric resonator 96, however, an ensurable bandwidth is only about 2% of its resonance frequency due to restriction in mode, although the resonator can trap the vibrational energy. In the market, therefore, the tuning fork type piezoelectric resonator 96 cannot satisfy the urgent need for a wideband piezoelectric resonator which is useable in a kHz band.

SUMMARY OF THE INVENTION

An object of the present invention is to provide an energy trap chip-type piezoelectric resonance component which is useable in various frequency bands including a kHz band, and capable of attaining characteristics in a larger bandwidth.

According to one aspect of the present invention, a chip-type piezoelectric resonance component includes a piezoelectric resonator having a piezoelectric resonance unit, a dynamic damper which is formed to vibrate by receiving vibration propagated from the piezoelectric resonance unit, and a holding part which is coupled to the dynamic damper, a spacer plate which is bonded to the holding part of the piezoelectric resonator and arranged to enclose a vibrating part of the piezoelectric resonator, and first and second case members which are fixed to hold an element plate formed by the piezoelectric resonator and the spacer plate, and spaces are defined between the first and second case members and the vibrating part of the piezoelectric resonator for allowing vibration of the vibrating part of the piezoelectric resonator.

In the chip-type piezoelectric resonance component according to the present invention, the aforementioned piezoelectric resonator having a dynamic damper is formed so as to cancel vibration as it is propagated, with the canceling of the vibration being achieved through a phenomenon of a dynamic damper, thereby trapping the vibrational energy. This phenomenon of a dynamic damper is described in detail in "Vibration Engineering" by Osamu Taniguchi, Corona Publishing Co., Ltd., pp. 113 to 116, for example. Briefly stated, the phenomenon of a dynamic damper is such a phenomenon that vibration of a principal vibrator which must be prevented from vibration is suppressed when a subvibrator is coupled to the principal vibrator and its natural frequency is properly selected. The aforementioned dynamic damper provided in the inventive piezoelectric resonance component corresponds to the subvibrator in this phenomenon of a dynamic damper, and suppresses vibration as it is propagated, with the vibration suppression being achieved on the basis of the phenomenon of a dynamic damper.

In the piezoelectric resonator of the inventive piezoelectric resonance component, therefore, vibrational energy of the resonance unit is trapped in a portion up to the dynamic damper. Thus, the piezoelectric resonator operates as an energy trap piezoelectric resonator.

According to the present invention, further, the spacer plate is bonded to the holding part of the piezoelectric resonator for enclosing the vibrating part of the piezoelectric resonator, to prevent the vibration of the vibrating part from being hindered, i.e., the piezoelectric resonance unit, the dynamic damper or a portion coupling the same with each other, while the first and second case members are fixed to upper and lower portions of the piezoelectric resonator. In addition, spaces are defined between the first and second case members and the piezoelectric resonator, to allow vibration of the vibrating part of the piezoelectric resonator. Thus, it is possible to form a chip-type piezoelectric resonance component which is suitably surface-mounted on a substrate.

The piezoelectric resonance unit can be formed to have a structure of a piezoelectric resonance unit utilizing a length vibration mode, utilizing an expansion vibration mode of a rectangular plate, or utilizing a shear vibration mode. Thus, it is possible to provide a wideband energy trap chip-type piezoelectric resonance component which is suitably useable in a wide frequency band including kHz and MHz bands.

According to a specific aspect of the present invention, the piezoelectric resonator and the spacer plate are formed by an integral member in the aforementioned element plate. In this structure, the spacer plate has first and second spacer plates so that the first spacer plate is bonded to first ends of first and second holding parts of the piezoelectric resonator and the second spacer plate is bonded to second ends of the first and second holding parts thereby defining an opening in a region formed by the first and second spacer plates and the first and second holding plates for receiving the piezoelectric resonance unit and the dynamic damper. The first and second spacer plates and the piezoelectric resonator are formed by an integral member, i.e., a rectangular frame type support member having an opening in each of fifth to ninth embodiments as hereinafter described. Thus, the piezoelectric resonator is enclosed with the rectangular frame type spacer plate, and no bonded portion is provided under the piezoelectric resonator. Therefore, it is possible to improve sealing performance of the inventive energy trap chip-type piezoelectric resonance component.

When the piezoelectric resonator and the spacer plate are formed by an integral member as described above, it is possible to readily prepare a rectangular plate-type member comprising a piezoelectric ceramic plate or a metal plate provided with a piezoelectric thin film thereon by laser beam machining or etching, in formation of the rectangular frame type spacer plate and the piezoelectric resonator. Thus, it is possible to simplify the step of forming the element plate, leading to simplification of the steps of manufacturing the chip-type piezoelectric resonance component. Therefore, it is possible to provide a piezoelectric resonance component as an energy trap chip-type resonance component having excellent environment resistance such as moisture resistance which can be used at various frequencies, through simplified manufacturing steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
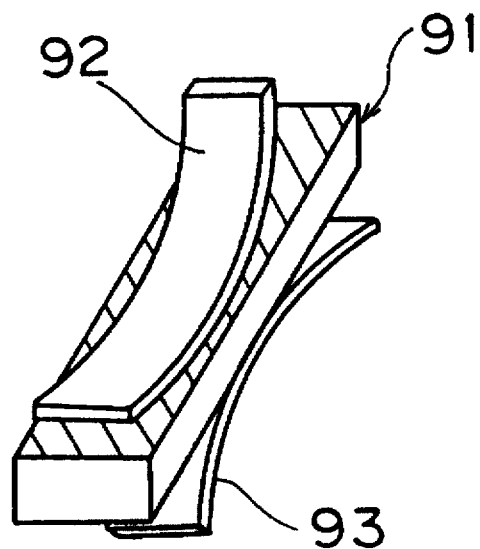
FIGS. 1A and 1B are a perspective view and a plan view for illustrating conventional piezoelectric resonators respectively.
Figure 1B:
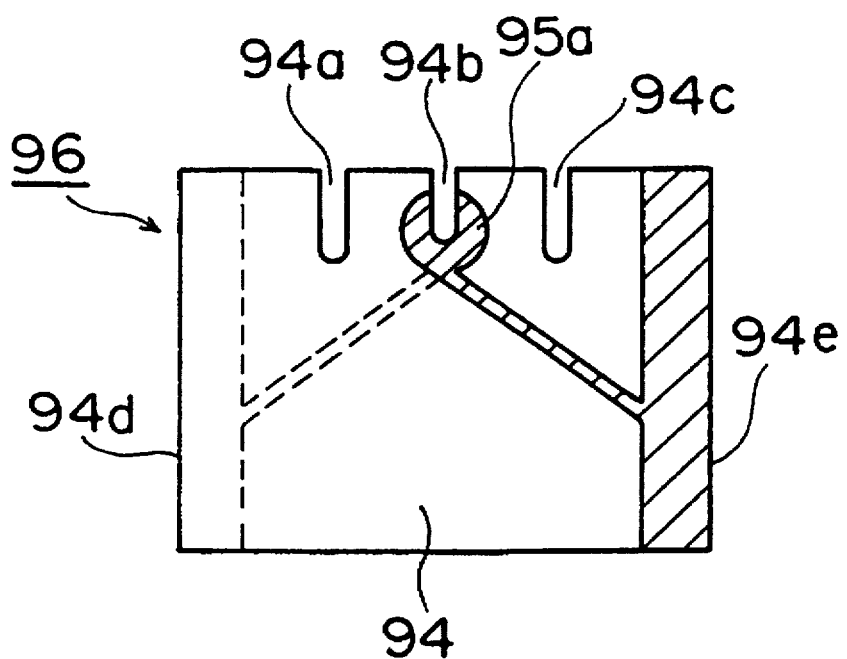
Figure 2:
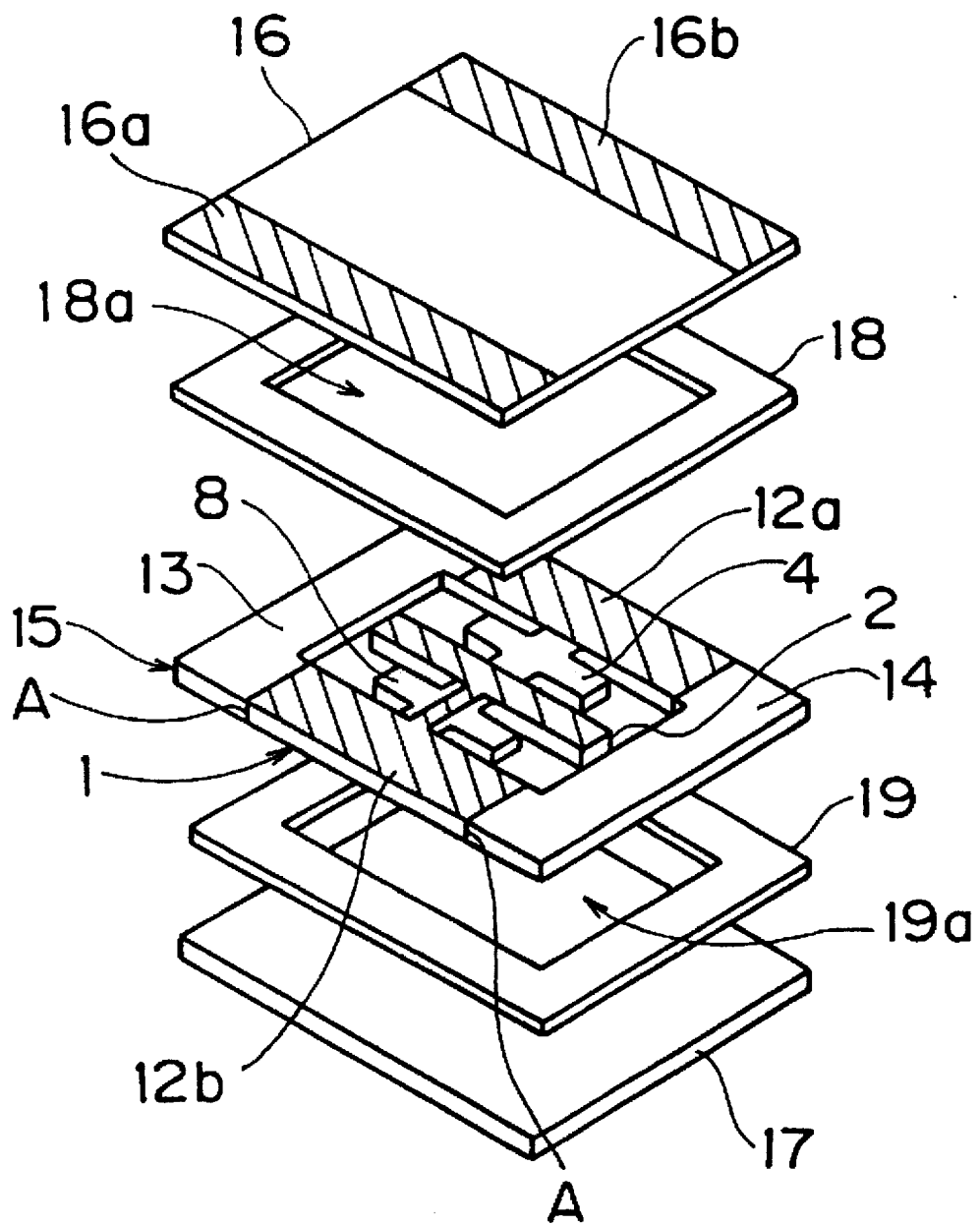
FIG. 2 is an exploded perspective view showing a chip-type piezoelectric resonance component according to a first embodiment of the present invention.

FIG. 2 is an exploded perspective view showing a chip-type piezoelectric resonance component according to a first embodiment of the present invention. A plate type piezoelectric resonator 1 is employed in the chip-type piezoelectric resonance component according to this embodiment. The piezoelectric resonator 1, which has a piezoelectric resonance unit 2 utilizing a length vibration mode, is formed as an energy trap piezoelectric resonator, as hereafter described.

Figure 3A:
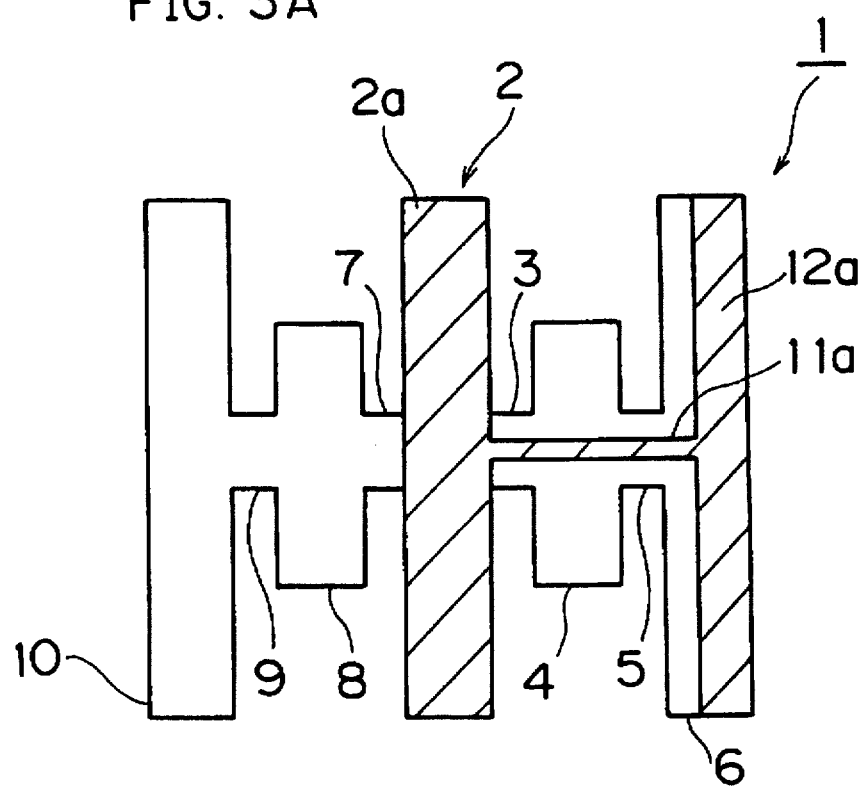
FIGS. 3A and 3B are a plan view of a piezoelectric resonator employed in the first embodiment of the present invention and a typical plan view showing shapes of lower electrodes through a ceramic plate.
Figure 3B:
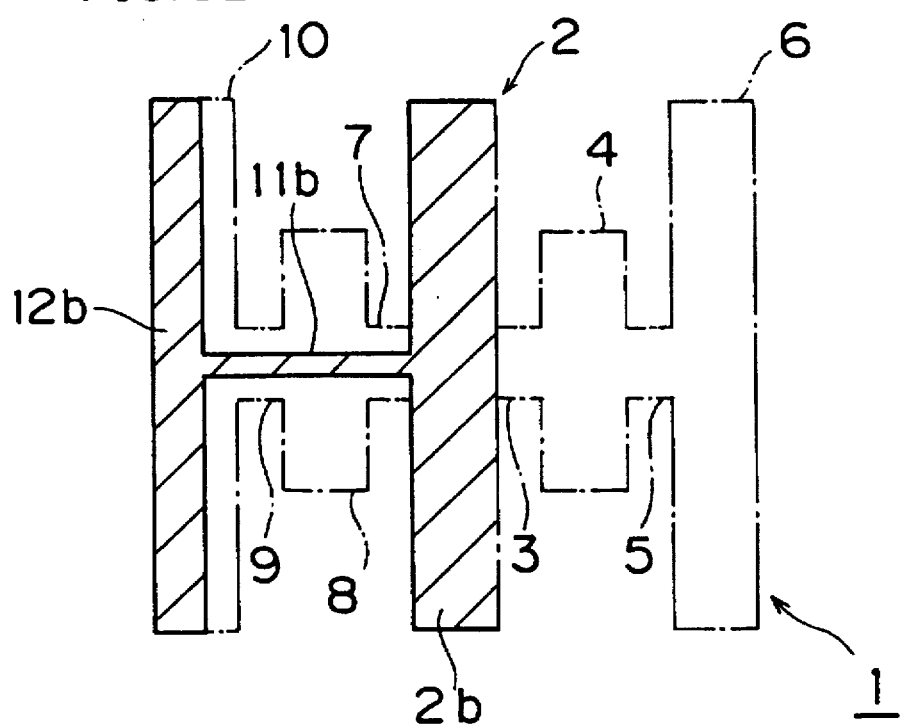

As shown in FIGS. 3A and 3B, the piezoelectric resonator 1 is provided on its center with the piezoelectric resonance unit 2 having an elongated rectangular shape. This piezoelectric resonance unit 2 is formed by uniformly polarizing an elongated piezoelectric ceramic plate along its thickness and providing resonance electrodes 2a and 2b on upper and lower surfaces thereof. The piezoelectric ceramic plate forming the piezoelectric resonance unit 2 and a dynamic damper as well as a holding part as described later are prepared by machining a single ceramic plate to have the plane shape as illustrated according to this embodiment. Alternatively, these members may be formed independently of each other to be fixed to/integrated with each other by an adhesive or the like.

A vibration transmitting part 3 is coupled to one side surface of a longitudinal central portion of the piezoelectric resonance unit 2, while a dynamic damper 4 is coupled to an outer end of the vibration transmitting part 3. The vibration transmitting part 3 is coupled to a vibration nodal point of the piezoelectric resonance unit 2 which is present at its longitudinal central portion, for reducing leakage of vibration toward the vibration transmitting part 3. However, it is not inevitably necessary to couple the vibration transmitting part 3 to the longitudinal central portion of the piezoelectric resonance unit 2, since vibration, as it is propagated, is canceled by action of the dynamic damper 4 as described later.

The dynamic damper 4 is formed by a rectangular plate type part, to be capable of vibrating in a bending mode by vibration which is transmitted through the vibration transmitting part 5 upon resonance of the piezoelectric resonance unit 2. A specific vibration frequency of the dynamic damper 4 is preferably substantially equalized with the resonance frequency of the piezoelectric resonance unit 2, so that it is possible to further effectively suppress the vibration as propagated by a phenomenon of a dynamic damper.

A coupling bar 5 is coupled to a longitudinal central portion of the outer side of the dynamic damper 4, while a holding part 6 which is formed in a rectangular shape to have a certain degree of area is formed on another end of the coupling bar 5.

A vibration transmitting part 7, a dynamic damper 8, a coupling bar 9 and a holding part 10 are also formed on an opposite side of the piezoelectric resonance unit 2, similarly to the side provided with the dynamic damper 4.

The resonance electrode 2a is electrically connected to a terminal electrode 12a, which is formed on an upper surface of the holding part 6, through a connecting conductive part 11a. Similarly, the resonance electrode 2b is electrically connected to a terminal electrode 12b, which is formed on a lower surface of the holding part 10, by a connecting conductive part 11b.

In the piezoelectric resonator 1, an alternating voltage is applied from the terminal electrodes 12a and 12b across the resonance electrodes 2a and 2b, to cause stretching vibration of the piezoelectric resonance unit 2 in a length mode. The vibration leaking toward the vibration transmitting parts 3 and 7 is suppressed by a phenomenon of a dynamic damper, due to vibration of the dynamic dampers 4 and 8. Thus, the vibration is trapped in portions up to the dynamic dampers 4 and 8, whereby the energy trap piezoelectric resonator 1 is formed by the piezoelectric resonance unit 2 utilizing a length vibration mode.

Thus, the energy trap piezoelectric resonator 1 is formed as a piezoelectric resonator for a frequency band such as a kHz band, which has been hard to implement in general.

Referring again to FIG. 2, first and second spacer plates 13 and 14 are coupled to the holding parts 6 and 10 of the piezoelectric resonator 1 according to this embodiment. Namely, the spacer plates 13 and 14 are bonded to the holding parts 6 and 10 to extend along the holding parts 6 and 10, respectively. In this case, the spacer plates 13 and 14 are shaped so as to enclose vibrating parts, i.e., the piezoelectric resonance unit 2, the vibration transmitting parts 3 and 7 and the dynamic dampers 4 and 8 of the piezoelectric resonator 1, to prevent the vibration of the resonator from being hindered. These spacer plates 13 and 14 can be formed by proper materials having a certain degree of rigidity such as insulating ceramic plates of alumina or synthetic resin plates.

An element plate 15 is formed by bonding the spacer plates 13 and 14 to the piezoelectric resonator 1. First and second case members 16 and 17 in the form of rectangular plates are bonded to upper and lower surfaces of the element plate 15 through sheet-type adhesives 18 and 19 respectively.

The case members 16 and 17 are formed by proper materials such as insulating ceramic plates of alumina or synthetic resin plates respectively, to serve as protective members for the chip-type piezoelectric resonance component according to this embodiment.

The sheet-type adhesives 18 and 19 are formed in rectangular frame type plane shapes having openings 18a and 19a as shown in FIG. 2, in order to ensure spaces for allowing vibration above and under the vibrating parts of the piezoelectric resonator 1 in the finally obtained chip-type piezoelectric resonance component.

The sheet-type adhesives 18 and 19 can be made of a proper material as long as the adhesives have the plane shapes as illustrated and can bond the element plate 15 with the first and second case members 16 and 17. For example, rectangular frame type adhesives which are supported on synthetic resin films may be transferred onto the element plate 15 or the case members 16 and 17. Alternatively, the sheet-type adhesives 18 and 19 may be replaced by adhesives which are supplied onto both major surfaces of the element plate 15, or lower and upper surfaces of the case members 16 and 17 in the form of rectangular frames.

Electrodes 16a and 16b are formed on the upper surface of the first case member 16. Similar electrodes are also formed on the lower surface of the case member 17 along opposite edges.

Figure 4:
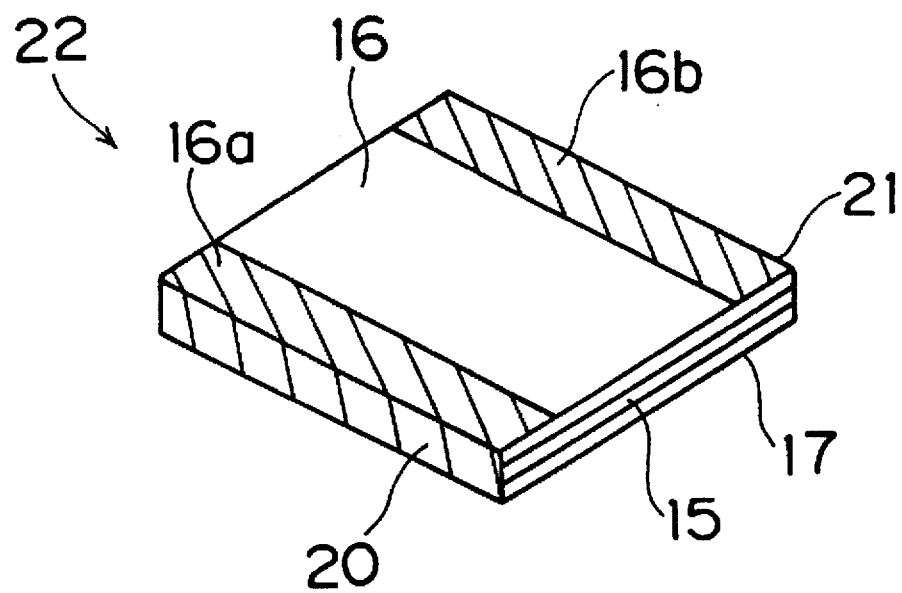
FIG. 4 is a perspective view showing the chip-type piezoelectric resonance component according to the first embodiment of the present invention.

The chip-type piezoelectric resonance component according to this embodiment is obtained by stacking the aforementioned members in the state shown in FIG. 2, bonding the stacked members with each other, and thereafter forming external electrodes 20 and 21 on both ends of the laminate as obtained, as shown in FIG. 4. Referring to FIG. 4, the chip-type piezoelectric resonance component 22 according to this embodiment can be efficiently and reliably surface-mounted on a printed circuit board or the like with an automatic machine since the component 22 is in the form of a rectangular plate as a whole with the external electrodes 20 and 21 provided on its opposite end surfaces.

The electrodes 16a and 16b which are provided on the upper surface of the case member 16 form parts of the external electrodes 20 and 21. Such electrodes 16a and 16b may be previously formed on the case member 16, so that the external electrodes 20 and 21 are formed to cover only both end surfaces of the laminate. However, the electrodes 16a and 16b may not be previously formed on the upper surface of the case member 16, and the external electrodes 20 and 21 are preferably formed not only on the opposite end surfaces of the chip-type piezoelectric resonance component 22 but to reach upper and lower surfaces thereof in this case.

Figure 5:
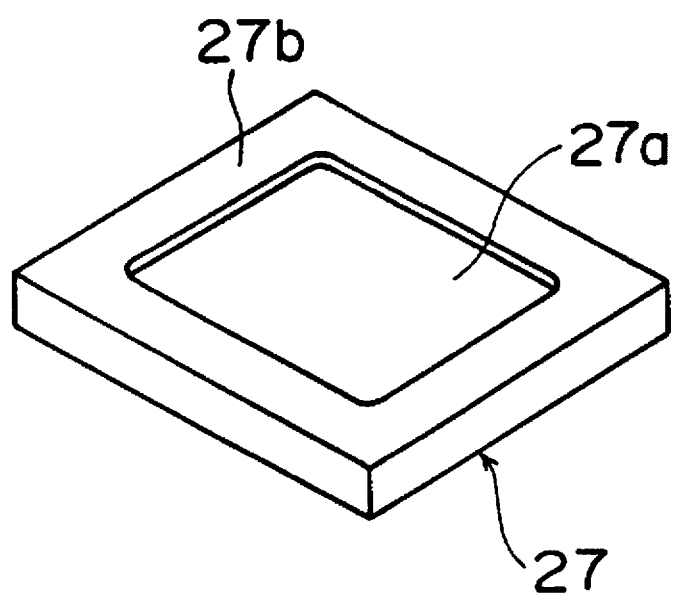
FIG. 5 is a perspective view showing a modification of a case member.

FIG. 5 is a perspective view showing a case member 27, which is a modification of the case member 17. The case member 27 shown in FIG. 5 is provided with a rectangular concave portion 27a in its upper surface. When the case member 27 is employed in place of the case member 17, therefore, it is possible to reliably define a space for allowing vibration of the vibrating parts of the piezoelectric resonator 1 by the concave portion 27a. Thus, it is possible to paste the element plate 15 and the case member 27 to each other while reliably ensuring the aforementioned space by simply applying an adhesive which is necessary for bonding the element plate 15 and the case plate 27 to a periphery 27b of the concave portion 27a. Therefore, it is possible to further reliably define the space for allowing vibration under the piezoelectric resonator 1 as compared with the case of employing the case member 17 shown in FIG. 2.

The upper case member 16 may also be replaced by that provided with a concave portion in its lower surface, to reliably define a space for allowing vibration above the piezo resonator 1.

Figure 6:
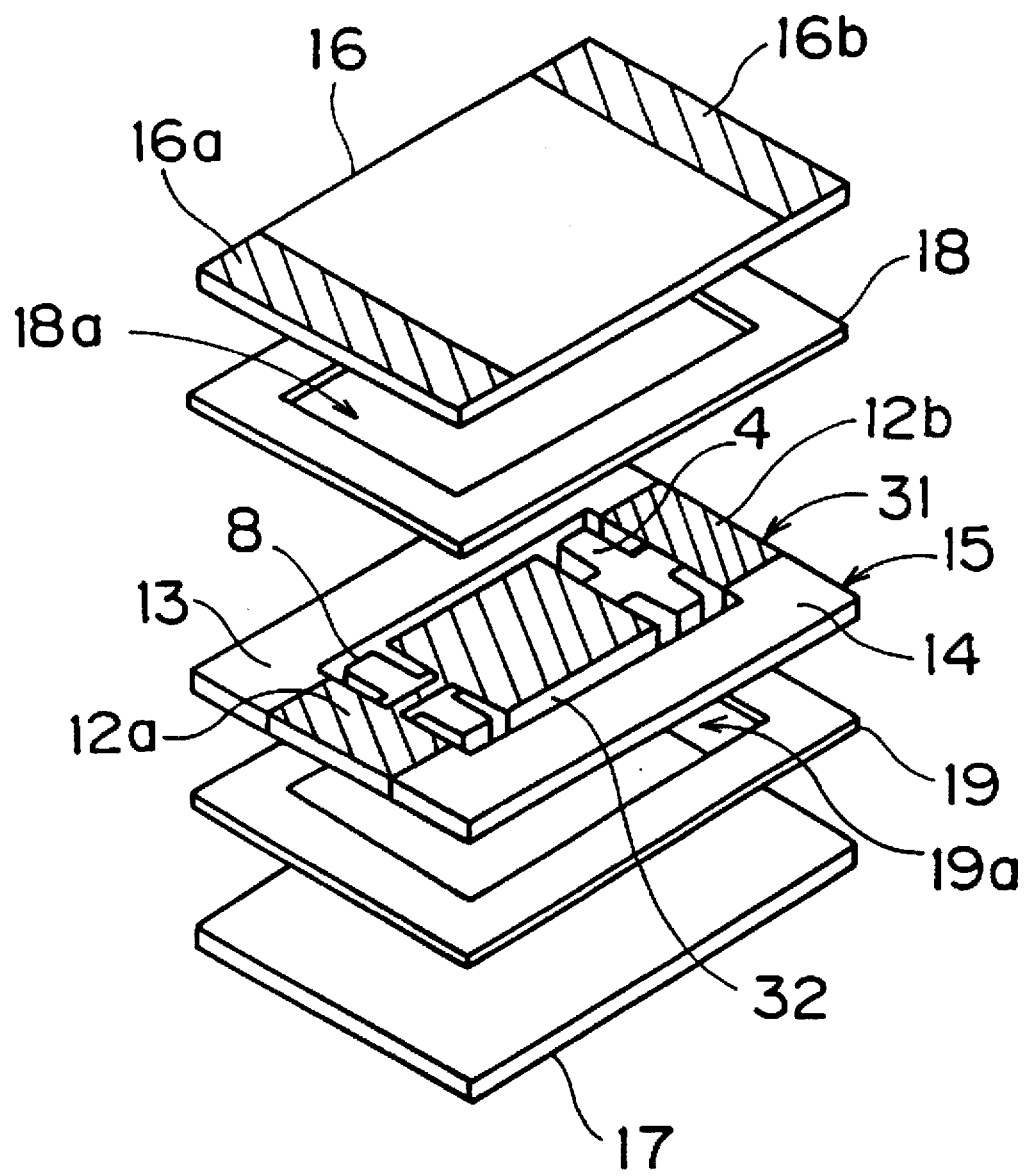
FIG. 6 is an exploded perspective view showing a chip-type piezoelectric resonance component according to a second embodiment of the present invention.
Figure 7A:
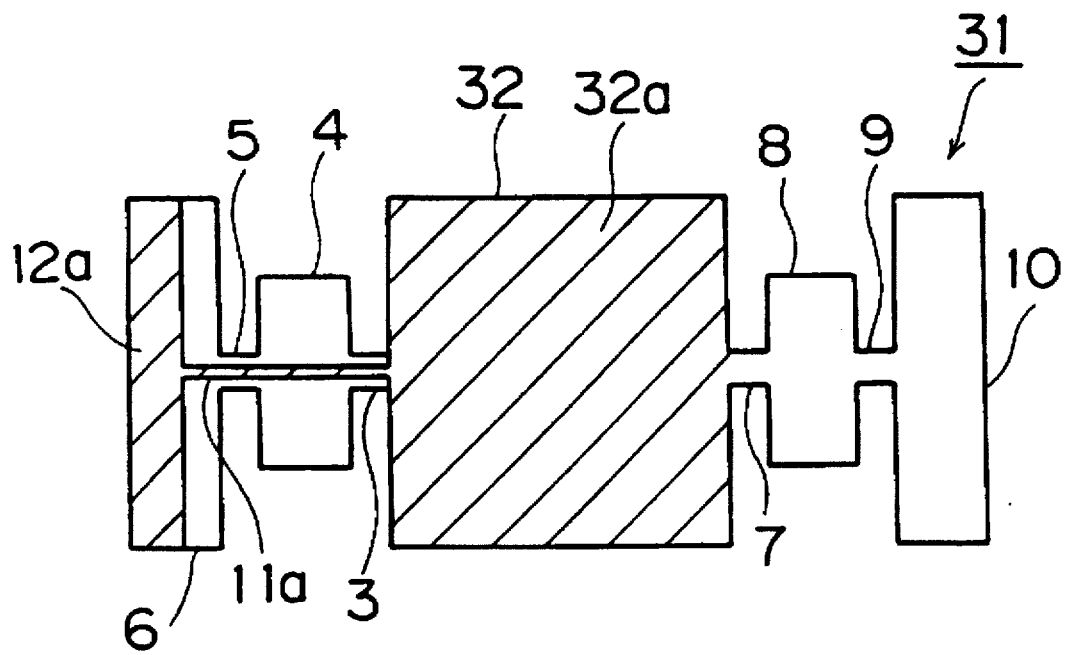
FIGS. 7A and 7B are a plan view of a piezoelectric resonator employed in the second embodiment of the present invention and a typical plan view showing shapes of lower electrodes through a ceramic plate.
Figure 7B:
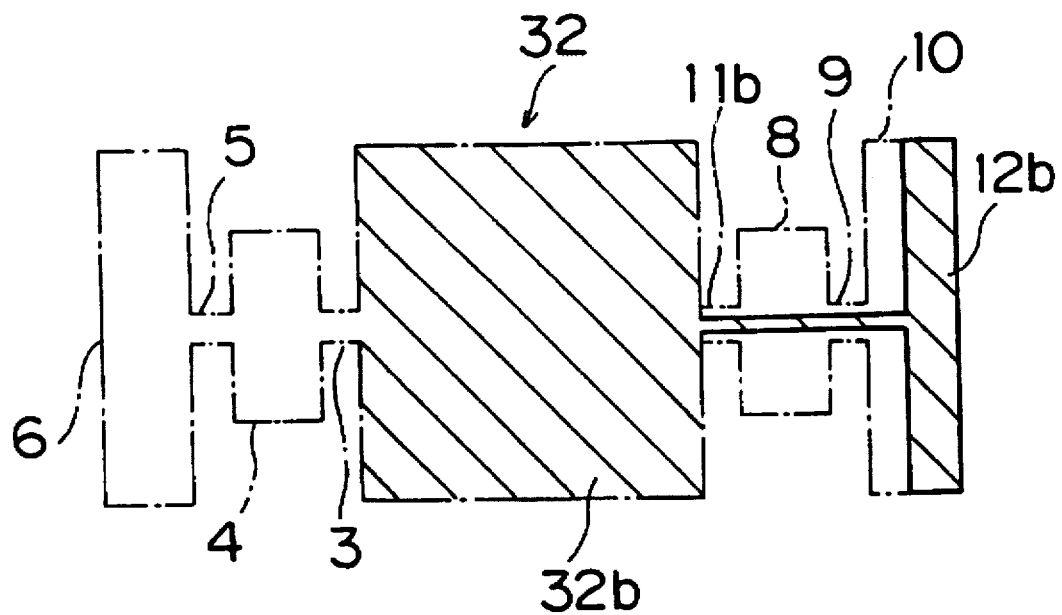
Figure 8:
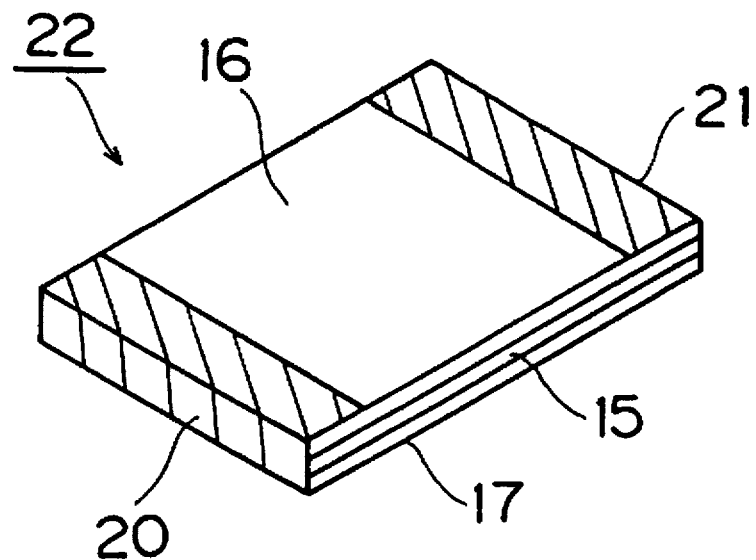
FIG. 8 is a perspective view showing the chip-type piezoelectric resonance component according to the second embodiment of the present invention.

FIGS. 6 to 8 show a chip-type piezoelectric resonance component according to a second embodiment of the present invention.

Referring to FIG. 6, a piezoelectric resonator 31 is formed by a piezoelectric resonance unit 32 utilizing an expansion vibration mode of a rectangular piezoelectric plate in the second embodiment. Other points of the second embodiment are similar to those of the first embodiment, and hence corresponding portions are denoted by corresponding reference numerals, to omit redundant description.

As clearly understood from FIGS. 7A and 7B, the piezoelectric resonator 31 is provided on its center with the piezoelectric resonance unit 32 utilizing an expansion vibration mode of a rectangular plate. The piezoelectric resonance unit 32 is formed by providing resonance electrodes 32a and 32b on both major surfaces of a rectangular piezoelectric ceramic plate which is uniformly polarized along its thickness. When an alternating voltage is applied from terminal electrodes 12a and 12b, therefore, the piezoelectric resonance unit 32a resonates in the aforementioned expansion mode. Nodal points of the expansion mode vibration are positioned at central portions of four sides of the rectangular piezoelectric ceramic plate. Therefore, vibration transmitting parts 3 and 7 are coupled to central portions of opposite sides. Vibration leaking toward the vibration transmitting parts 3 and 7 is suppressed by dynamic dampers 4 and 8 due to a phenomenon of a dynamic damper. Thus, vibrational energy is trapped in portions up to the dynamic dampers 4 and 8, similarly to the piezoelectric resonator 1 according to the first embodiment.

According to the second embodiment, therefore, an energy trap piezoelectric resonator utilizing an expansion vibration mode is implemented, to form a wideband energy trap piezoelectric resonator for a frequency band such as a kHz band, which has been hard to implement in general.

Also in the second embodiment, an element plate 15 is formed by coupling spacer plates 13 and 14 to side portions of the piezoelectric resonator 31, to prevent vibration of the vibrating parts of the piezoelectric resonator 31 from being hindered. Further, rectangular plate type case members 16 and 17 are bonded to upper and lower portions of the element plate 15 through sheet-type adhesives 18 and 19, to form the chip-type piezoelectric resonance component 22 shown in FIG. 8.

Figure 9:
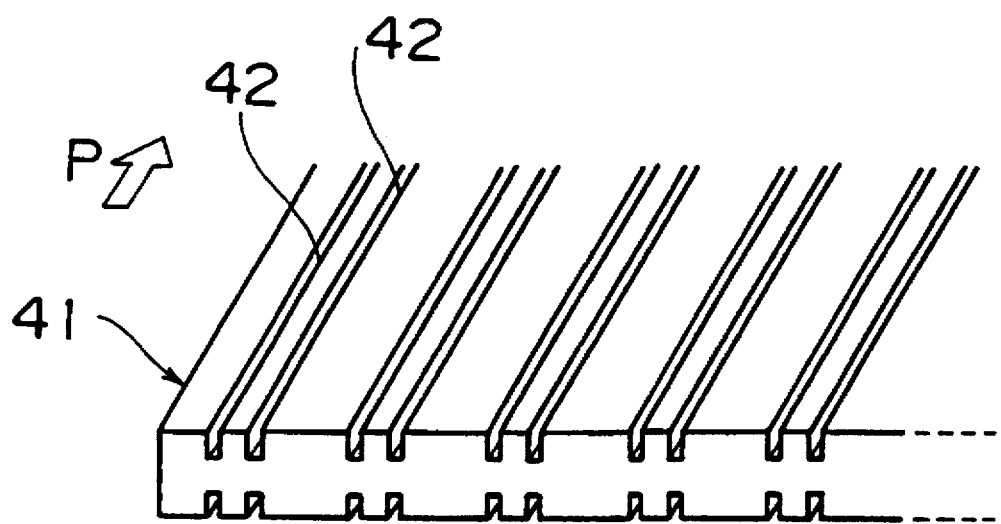
FIG. 9 is a perspective view showing a ceramic block employed for obtaining an element plate in the second embodiment of the present invention.
Figure 10:
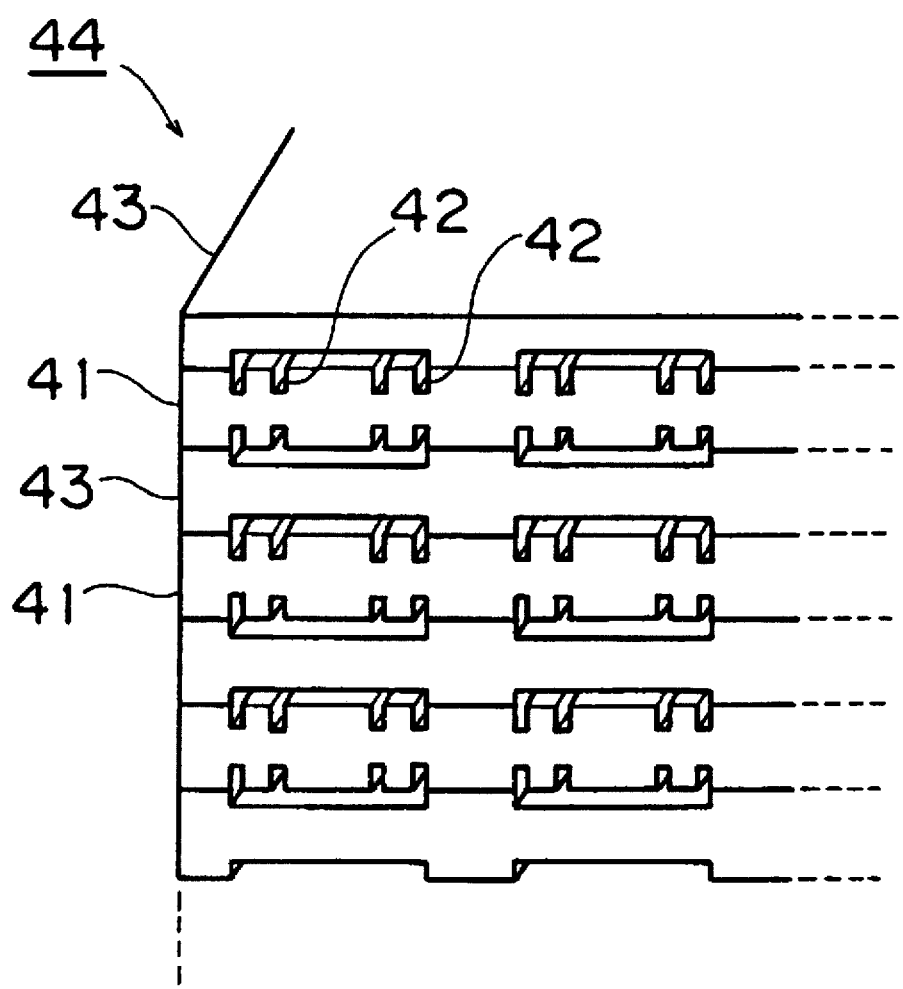
FIG. 10 is a partially fragmented perspective view showing a laminate which is formed by stacking ceramic blocks for obtaining a piezoelectric resonator and a spacer plate with each other.
Figure 11:
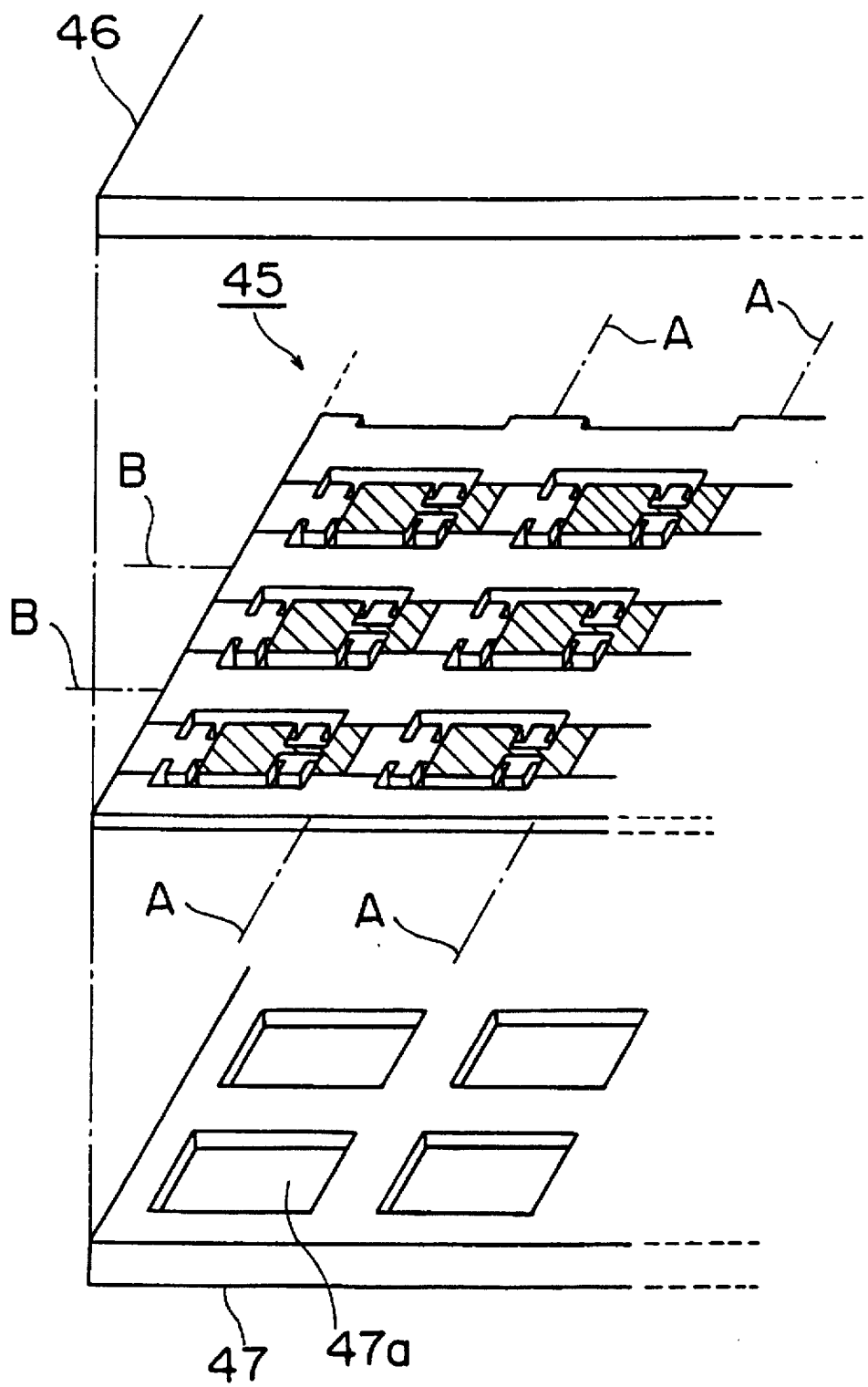
FIG. 11 is a perspective view showing a mother wafer for obtaining element plates.

Description is now made of a method of manufacturing an element plate including the piezoelectric resonator according to the second embodiment with reference to FIGS. 9 to 11.

As shown in FIG. 9 in a partially fragmented perspective view, a plurality of grooves 42 are formed in both major surfaces of a ceramic block 41, which is polarized along arrow P, by machining such as dicing. Each of these grooves 42 are adapted to define portions forming the piezoelectric resonance unit dynamic dampers and holding parts.

As shown in FIG. 10 in a schematic perspective view, such ceramic blocks 41 provided with the grooves 42 are alternately stacked with ceramic blocks 43 for forming spacer plates, to obtain a mother laminate Thereafter, the mother laminate 44 shown in FIG. 10 is sliced to obtain a mother wafer 45 shown in FIG. 11. Then, electrodes are formed by vapor deposition or the like, and mother substrates 46 and 47 are bonded to upper and lower portions of the mother wafer 45, respectively. Thereafter, this laminate is cut along one-dot chain lines A and B along its thickness. Thus, it is possible to efficiently mass-produce finished products not yet provided with end electrodes according to the second embodiment. The mother substrate 47 is provided with concave portions 47a for allowing vibration spaces, while the mother substrate 46 is also provided with similar concave portions (not shown).

While the above description has been made with reference to steps of manufacturing the element plate 15 according to the second embodiment, the element plate 15 according to the first embodiment can also be efficiently mass-produced in a similar manner to that described above.

Figure 12:
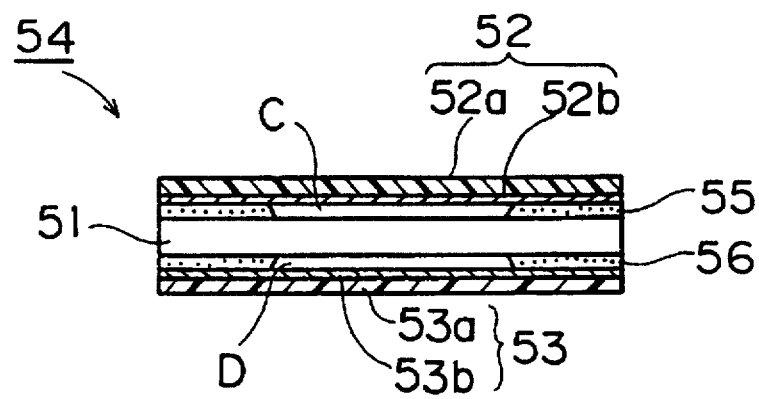
FIG. 12 is a sectional view for illustrating a chip-type piezoelectric resonance component according to a third embodiment of the present invention.

FIG. 12 is a sectional view for illustrating a chip-type piezoelectric resonance component according to a third embodiment of the present invention. According to the third embodiment, case members 52 and 53 are stacked on upper and lower portions of a plate type energy trap piezoelectric resonator 51 which is capable of trapping vibration, with the vibration trapping being achieved through a phenomenon of a dynamic damper, to form a chip-type piezoelectric resonance component 54 similarly to the first and second embodiments, for example. According to this embodiment, spaces C and D for allowing vibration of vibrating parts of the piezoelectric resonator 51 are defined above and under an element plate 51 by adhesive layers 55 and 56. The case members 52 and 53 are formed by pasting synthetic resin films 52b and 53b onto first surfaces of thermosetting resin plates 52a and 53b, respectively. Thus, the case members 52 and 53 can be formed by proper insulating materials such as synthetic resin films.

Figure 13:
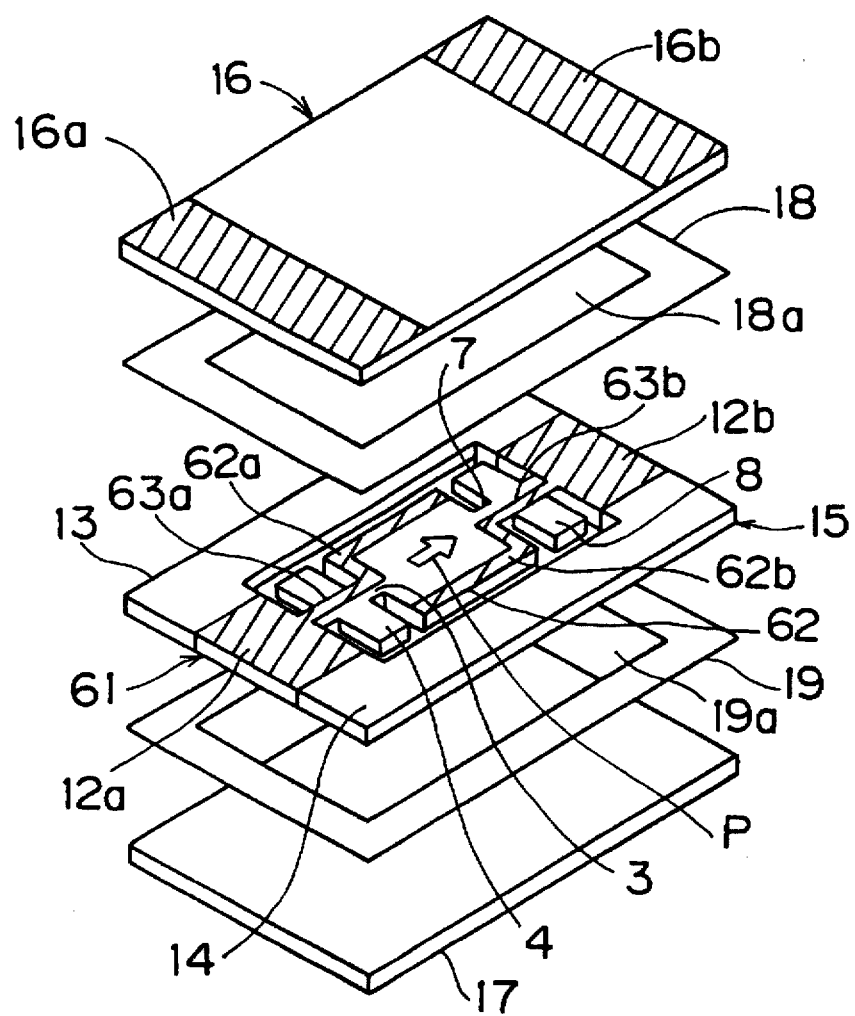
FIG. 13 is an exploded perspective view for illustrating a chip-type piezoelectric resonance component according to a fourth embodiment of the present invention.
Figure 14:
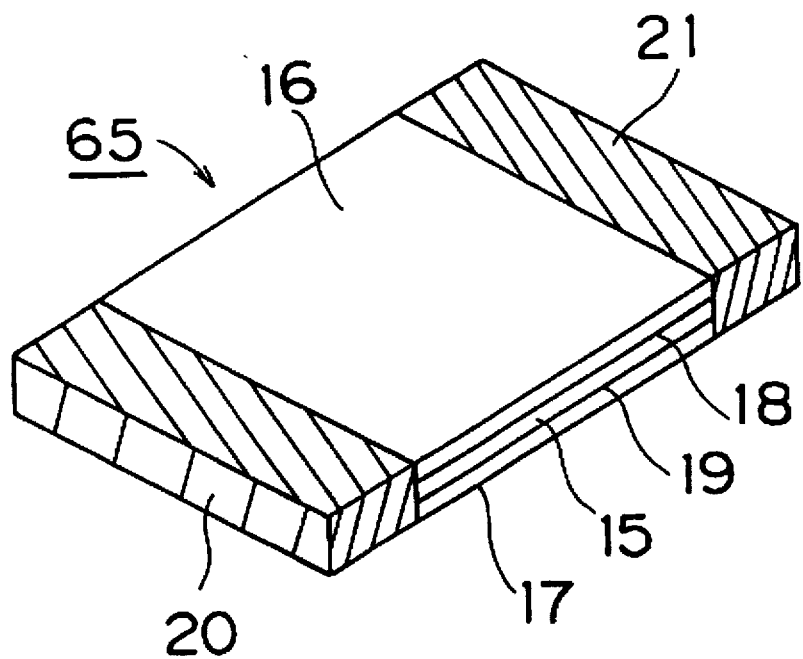
FIG. 14 is a perspective view showing the chip-type piezoelectric resonance component according to the fourth embodiment of the present invention.

FIGS. 13 and 14 show a chip-type piezoelectric resonance component according to a fourth embodiment of the present invention.

Referring to FIG. 13, a piezoelectric resonator 61 is formed by a piezoelectric resonance unit 62 utilizing a width shear vibration mode according to the fourth embodiment. The piezoelectric resonance unit 62 is formed by a piezoelectric ceramic plate having a rectangular plane shape, which is polarized so that polarization axes are regularized along the arrow P in parallel with its major surface.

The piezoelectric ceramic plate is provided on its upper surface with a pair of resonance electrodes 62a and 62b along both edges in parallel with the direction P of polarization. No resonance electrodes are formed on a lower surface of the piezoelectric ceramic plate. Therefore, the resonance electrodes 62a and 62b provided on the upper surface are electrically connected with terminal electrodes 12a and 12b, which are formed on an upper surface of a holding part, through connecting conductive parts 63a and 63b, respectively.

According to this embodiment, both of the terminal electrodes 12a and 12b are formed on the upper surface of the holding part, as clearly understood from FIG. 13. Other points of this embodiment are similar to those of the first embodiment.

As clearly understood from FIG. 13, the piezoelectric resonance unit 62 resonates in a width shear vibration mode when an alternating voltage is applied from the terminal electrodes 12a and 12b, since the piezoelectric resonance unit 82 utilizing a width shear vibration mode is arranged at the center of the piezoelectric resonator 81.

Further, vibration transmitting parts 3 and 7 are coupled to the piezoelectric resonance unit 82, and dynamic dampers 4 and 8 are coupled to other ends of the vibration transmitting parts 3 and 7. Thus, vibrational energy is trapped in portions up to the dynamic dampers 4 and 8, similarly to the piezoelectric resonator 1 in the first embodiment of the present invention.

Thus, an energy trap piezoelectric resonator utilizing a width shear vibration mode is implemented according to the fourth embodiment.

Also in the fourth embodiment, spacer plates 13 and 14 are coupled to side portions of the piezoelectric resonator 61 to prevent vibration of the vibrating parts of the piezoelectric resonator 61 from being hindered, thereby forming an element plate 15. Rectangular plate type case members 18 and 17 are bonded to upper and lower portions of the element plate 15 through sheet-type adhesives 18 and 19, to form the chip-type piezoelectric resonance component 65 shown in FIG. 14.

An exemplary method of manufacturing an element plate including the piezoelectric resonator according to the fourth embodiment is now described with reference to FIGS. 15A to 17.

Figure 15A:
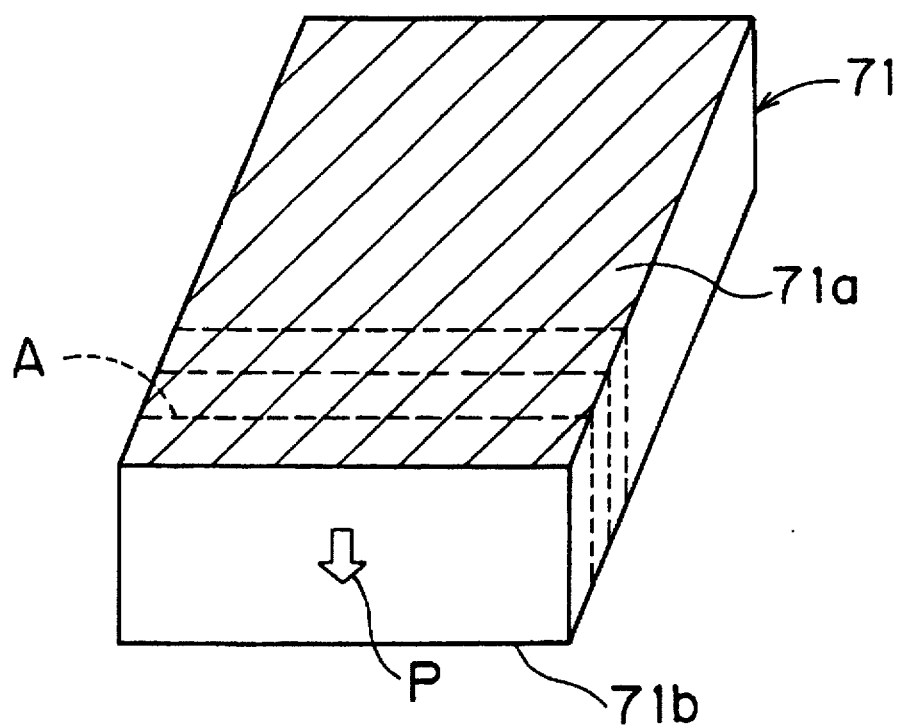
FIGS. 15A and 15B are perspective views showing a ceramic block for obtaining a piezoelectric resonator in the fourth embodiment of the present invention and a piezoelectric plate obtained by polarizing the ceramic block and thereafter cutting the same.

As shown in FIG. 15A, a block 71 of piezoelectric ceramics is prepared so that electrodes 71a and 71b are formed on overall upper and lower surfaces of the block 71. A dc voltage is applied across the electrodes 71a and 71b, to polarize the block 71 along arrow P.

Figure 15B:
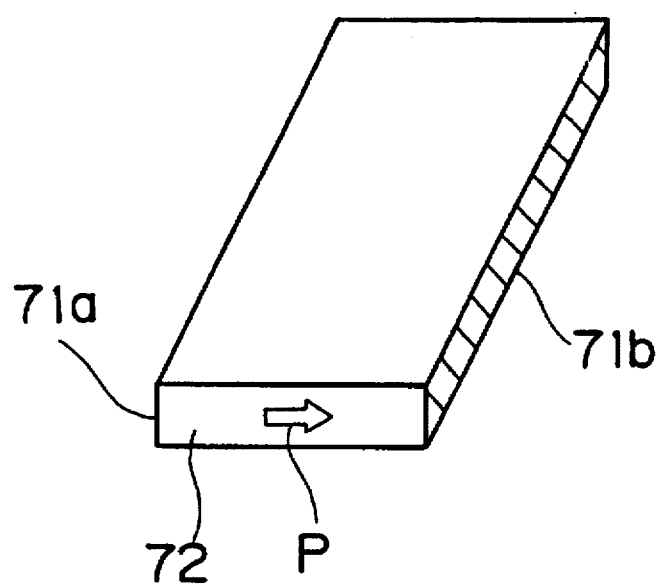

Then, the block 71 is cut along broken lines A, to obtain a piezoelectric plate 72 shown in FIG. 15B. This piezoelectric plate 72 is polarized along arrow P, in parallel with its major surface.

Figure 16:
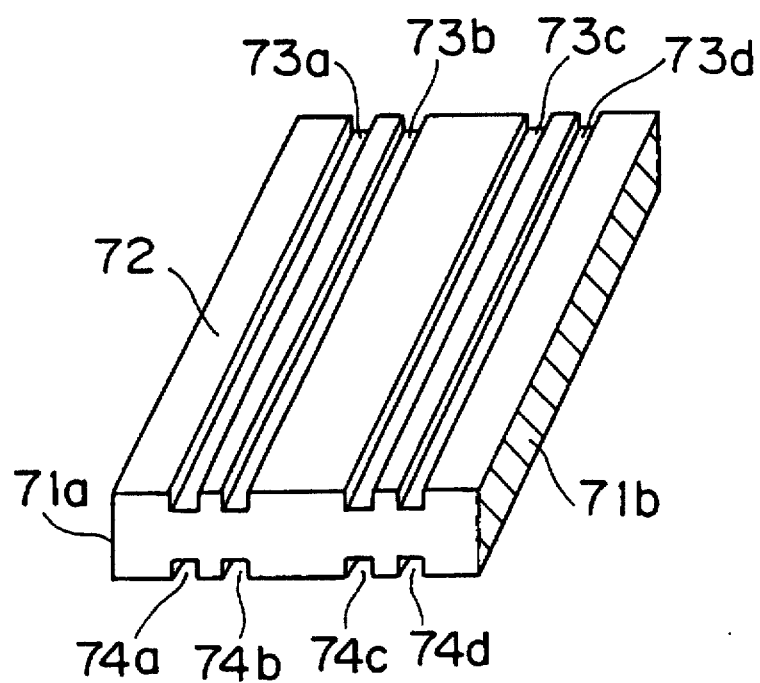
FIG. 16 is a perspective view showing the piezoelectric plate provided with a plurality of grooves.

Then, four grooves 73a to 73d as well as four grooves 74a to 74d are formed on upper and lower surfaces of the piezoelectric plate 72, respectively by machining such as dicing, as shown in FIG. 16.

Figure 17:
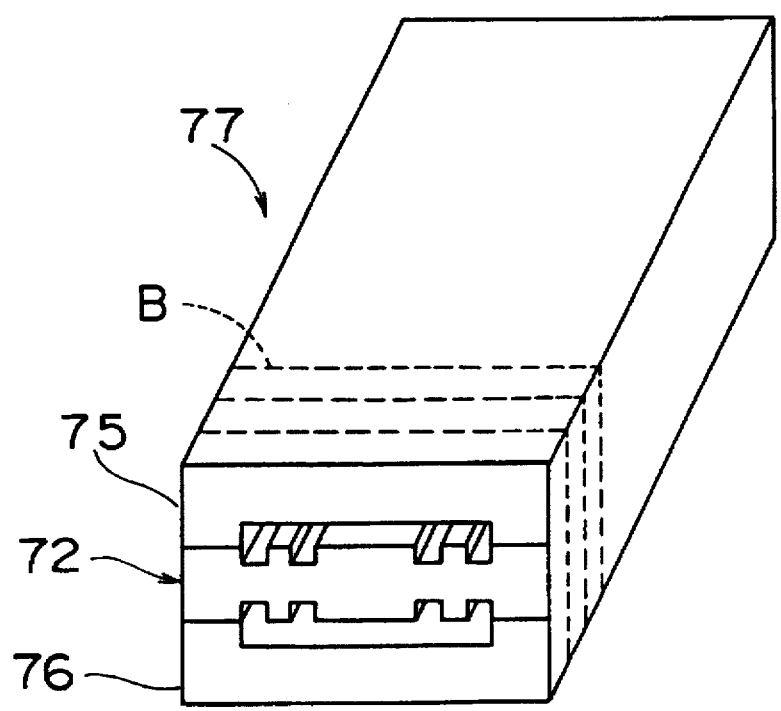
FIG. 17 is a perspective view showing the piezoelectric plate of FIG. 16 which is coupled with ceramic blocks for forming spacer plates on both surfaces thereof.

Then, ceramic blocks 75 and 76 for defining spacer plates are pasted onto upper and lower surfaces of the piezoelectric plate 72, as shown in FIG. 17. Thus, a mother coupled block 77 is obtained. It is possible to obtain a plurality of element plates 15 by cutting the mother coupled block 77 along broken lines B.

Figure 18:
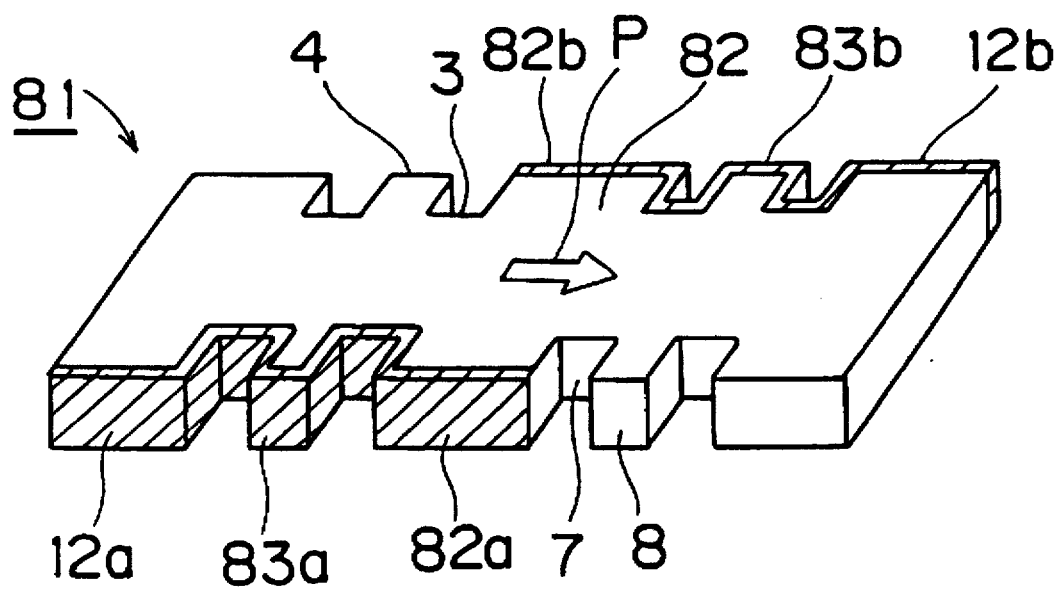
FIG. 18 is a perspective view for illustrating a modification of the piezoelectric resonator according to the fourth embodiment of the present invention.

While the resonance electrodes 62a and 62b, the connecting conductive parts 63a and 63b and the terminal electrodes 12a and 12b are formed on the upper surface of the piezoelectric resonator 61 utilizing a sheet mode according to the fourth embodiment, such elements may alternatively be formed on side surfaces of the piezoelectric resonator 61, as shown in FIG. 18. Referring to FIG. 18, resonance electrodes 82a and 82b are formed on a pair of opposite side surfaces of a piezoelectric ceramic plate which is polarized along arrow P in parallel with its major surface in a piezoelectric resonance unit 82 of a piezoelectric resonator 81. Further, connecting conductive parts 83a and 83b and terminal electrodes 12a and 12b are also formed along the side surfaces of the piezoelectric resonator 81. Other points of this modification are similar to those of the piezoelectric resonator 61, and hence corresponding portions are denoted by corresponding reference numerals.

In each of the aforementioned first to fourth embodiments, the piezoelectric resonator and the spacer plates are prepared as separate members, and bonded with each other to form the element plate. In this case, the manufacturing steps are complicated since it is necessary to bond the spacer plates onto the side portions of the piezoelectric resonator. In addition, bonded portions are present as shown by arrows A in FIG. 2 in the first embodiment, for example. Namely, the bonded portions A are present between the piezoelectric resonator 1 and the spacer plates 13 and 14 which are bonded with each other by insulating adhesives. As the result, the bonded portions A may be insufficient in sealing performance, leading to insufficient environment resistance such as moisture resistance in the piezoelectric resonance component as obtained.

Each of fifth to ninth embodiments of the present invention as hereafter described is adapted to improve environment resistance of a chip-type piezoelectric resonance component, as well as to simplify manufacturing steps therefor by eliminating the aforementioned bonded portions A.

Each of the fifth to ninth embodiments is characterized in a structure of an element plate as employed, while the structures in any of the first to fourth embodiments can be properly employed for first and second case members and structures for defining spaces for allowing vibration of a piezoelectric resonator. In each of the fifth to ninth embodiments, first and second spacer plates and first and second holding parts are formed by a rectangular frame type support member as described later.

Figure 19:
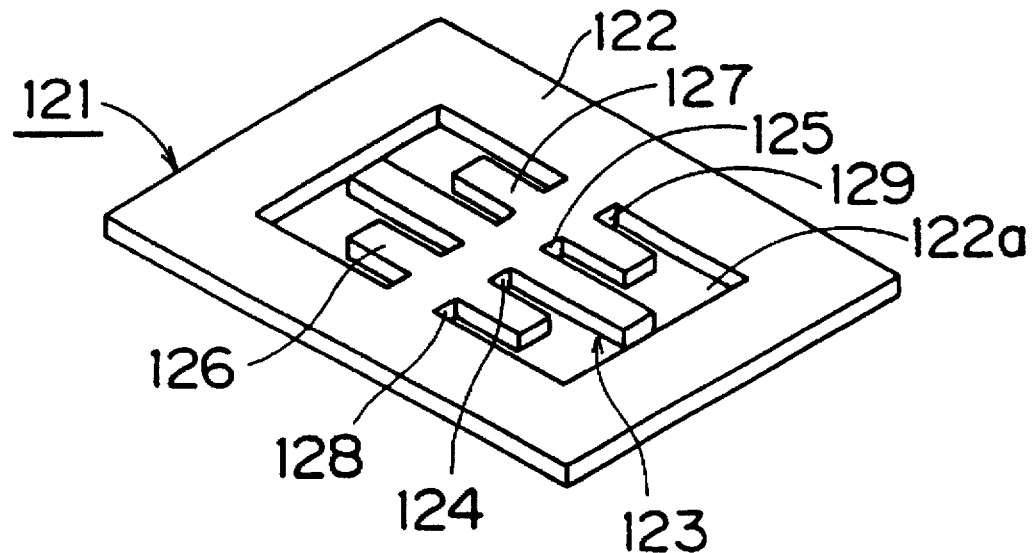
FIG. 19 is a perspective view for illustrating a step of forming an element plate which is employed in a fifth embodiment of the present invention.
Figure 20:
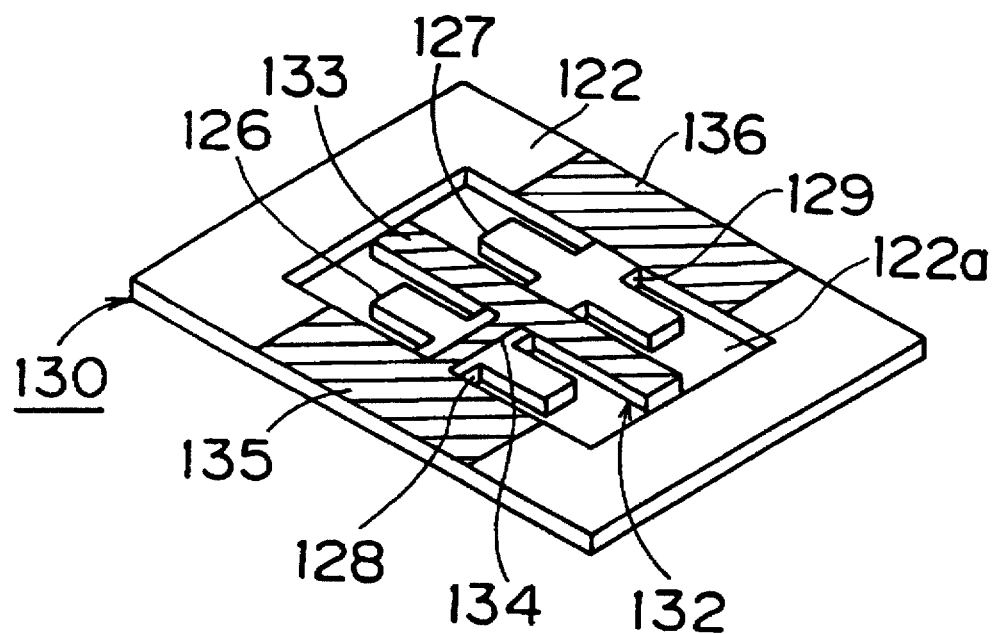
FIG. 20 is a perspective view showing the element plate employed in the fifth embodiment of the present invention.

FIG. 19 is a perspective view showing a piezoelectric ceramic plate 121 which is employed for forming a piezoelectric resonator according to the fifth embodiment. The piezoelectric ceramic plate 121 is formed by working a rectangular piezoelectric ceramic plate into the shape as illustrated. Namely, the piezoelectric ceramic plate 121 is prepared by forming a rectangular frame type support member 122 and a piezoelectric ceramic plate part 123 forming a piezoelectric resonator, which is arranged in an opening 122a of the rectangular frame type support member 122 by an integral member.

The elongated rectangular piezoelectric ceramic plate part 123 is arranged at the center for forming a piezoelectric resonance part, while dynamic dampers 126 and 127 for resonating in a bending mode are formed on both sides of the piezoelectric ceramic plate part 123 through support parts 124 and 125. Central portions of outer side surfaces of the dynamic dampers 126 and 127 are arranged in series with the rectangular frame type support member 122 through the support parts 128 and 129.

According to this embodiment, a resonance electrode 133, a lead conductive part 134 and a terminal electrode 135, as well as, a dummy electrode 136 are formed on an upper surface of the piezoelectric ceramic plate 121 while a second resonance electrode which is opposed to the resonance electrode 133, a lead conductive part which is connected to the second resonance electrode and a terminal electrode which is connected to the lead conductive part to be opposed to the electrode 136 are formed on a lower surface, to define an element plate 130.

The aforementioned electrodes can be formed by applying conductive materials onto the upper and lower surfaces of the piezoelectric ceramic plate 121 by vapor deposition, plating or sputtering.

In the element plate 130 employed in this embodiment, the rectangular frame type support member 122 and the piezoelectric resonator are formed by an integral member, i.e., the piezoelectric ceramic plate 121 shown in FIG. 19, as hereinabove described. This support member 122 defines the spacer plates 13 and 14 and the holding parts 6 and 10 in the first embodiment shown in FIG. 2. Thus, the element plate 130 can be employed in place of the element plate 15 in the piezoelectric resonance component shown in FIG. 2, for example. While the bonded portions A between the spacer plates 13 and 14 and the piezoelectric resonator may be insufficient in sealing performance in the embodiment shown in FIG. 2, it is possible to obtain a piezoelectric resonance component having excellent sealing performance according to this embodiment having no such bonded portions.

Figure 21A:
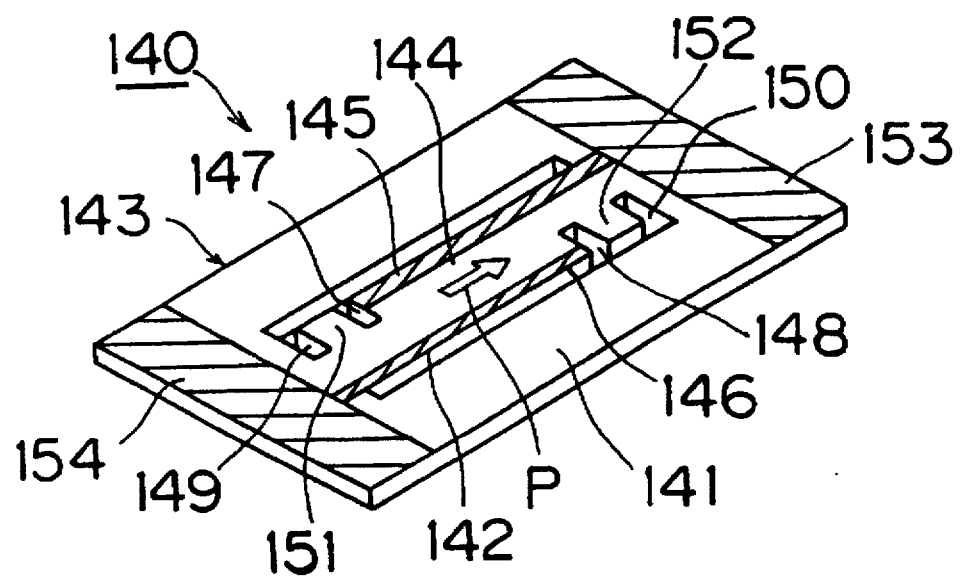
FIGS. 21A and 21B are a perspective view and a plan view for illustrating an element plate which is employed in a sixth embodiment of the present invention.
Figure 21B:
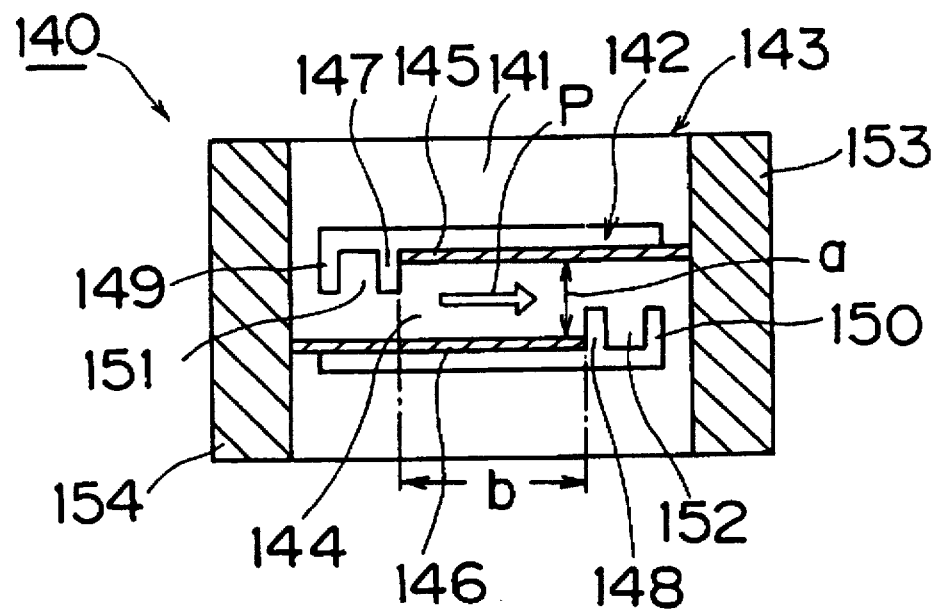

FIGS. 21A and 21B are a perspective view and a plan view for illustrating an element plate 140 which is employed in the sixth embodiment.

In the element plate 140 employed in this embodiment, a piezoelectric ceramic plate is worked by laser beam machining or etching to obtain a plate 143 comprising a rectangular frame type support member 141 and a part arranged in the support member 141 for forming a piezoelectric resonator 142, which are integrally formed with each other, similarly to the fifth embodiment. Thus, it is possible to omit a complicated operation of bonding spacer plates onto side portions of the piezoelectric resonator, similarly to the fifth embodiment.

This embodiment is characterized in that the piezoelectric resonator 142 is formed by an energy trap piezoelectric resonator utilizing a shear mode, which has vibration absorbing parts. Namely, the piezoelectric resonator 142 is provided with an elongated piezoelectric plate part 144 which is polarized so that polarization axes are longitudinally regularized along arrow P. This piezoelectric plate part 144 is provided on its upper surface with first and second resonance electrodes 145 and 148 along both edges.

Further, third and fourth grooves 149 and 150 are formed in portions outward beyond first and second grooves 147 and 148 in parallel with the same, thereby forming dynamic dampers 151 and 152. These dynamic dampers 151 and 152 are adapted to cancel vibration leaking from the resonance part.

Portions of the piezoelectric ceramic plate provided with the third and fourth grooves 149 and 150 are arranged in series with the aforementioned rectangular frame type support member 141. The first and second resonance electrodes 145 and 148 are electrically connected with terminal electrodes 153 and 154, which are formed on the upper surface of the rectangular frame type support member 141, respectively.

In the element plate 140 employed in this embodiment, therefore, a piezoelectric resonance unit is excited in a shear mode when an alternating voltage is applied from the terminal electrodes 153 and 154. This resonance energy is effectively trapped in the resonance unit, which is formed to have the following specific dimensional ratio b/a.

Assuming that b and a represent lengths of longer and shorter sides of the resonance unit having a rectangular plane shape and σ represents the Poisson's ratio of the piezoelectric ceramics, the ratio b/a is set within a range of ±10% about a value satisfying the following equation (1):

$$b/a = n(0.3\sigma + 1.48) \qquad (1)$$

where n represents an integer.

Due to the dynamic dampers 151 and 152 which are formed outside the resonance unit, slightly leaking vibration is further canceled. Thus, the vibrational energy is reliably trapped in portions up to the dynamic dampers 151 and 152.

Further, the support member 141 and the piezoelectric resonator 142 are formed by an integral member, i.e., a single piezoelectric ceramic plate similarly to the fifth embodiment, whereby it is possible to improve sealing performance in formation of a piezoelectric resonance component.

Figure 22:
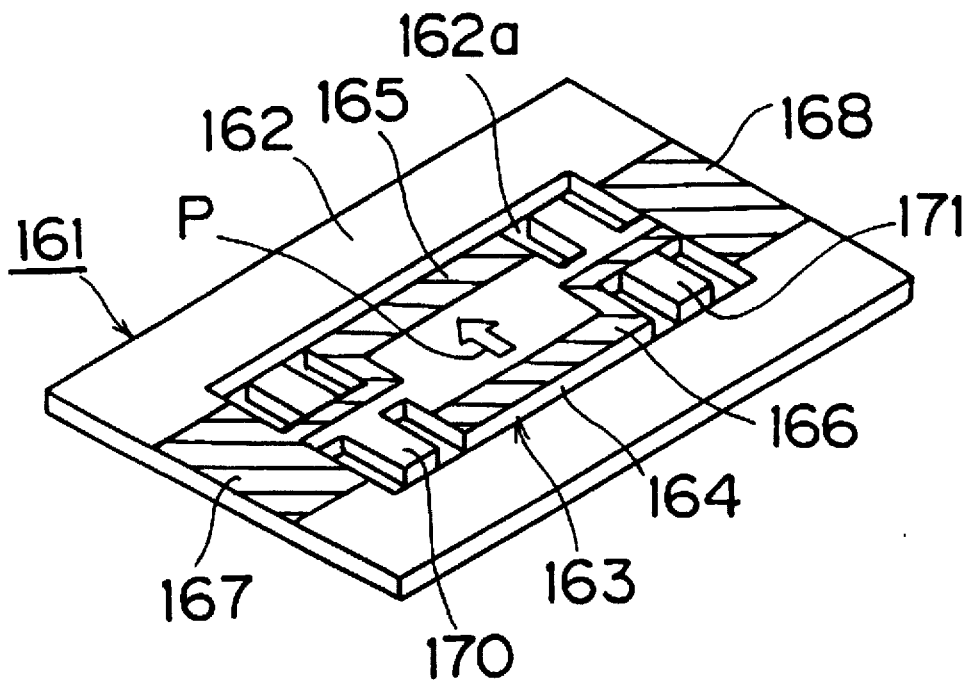
FIG. 22 is a perspective view showing an element plate which is employed in a seventh embodiment of the present invention.

FIG. 22 is a perspective view showing an element plate 161 which is employed in the seventh embodiment. The element plate 161 has a rectangular frame type support member 162, and a piezoelectric resonator 163 which is arranged in an opening 162a of the rectangular frame type support member 162. The piezoelectric resonator 163 and the support member 162 are formed by working a rectangular piezoelectric ceramic plate to have the plane shape as illustrated, similarly to the fifth embodiment.

The seventh embodiment is different from the fifth embodiment in the structure of the piezoelectric resonator 163 which is arranged in the opening 162a of the support member 162.

The piezoelectric resonator 163 has a rectangular piezoelectric ceramic plate part 164, which is polarized so that polarization axes are regularized along arrow P. In the rectangular piezoelectric ceramic plate part 164, a ratio b/a between its longer and shorter sides having lengths b and a is set within a range of ±10% about a value satisfying the following equation (2):

$$b/a = n(-1.47\sigma + 1.88) \qquad (2)$$

where n represents an integer, and σ represents the Poisson's ratio of the piezoelectric ceramics.

Further, the piezoelectric ceramic plate part 164 is provided on its upper surface with first and second resonance electrodes 154 and 155 along both ends. The first and second resonance electrodes 165 and 166 are electrically connected with first and second terminal electrodes 167 and 168, which are formed on an upper surface of the support member 162, by lead conductive parts.

According to this embodiment, a piezoelectric resonance part is excited in a width mode when an alternating voltage is applied from the first and second terminal electrodes 167 and 168. Since dynamic dampers 170 and 171 are coupled to outer sides of the resonance part through respective support parts, leaking vibrational energy is canceled by the dynamic dampers 170 and 171 due to a phenomenon of a dynamic damper. Thus, the vibrational energy is further effectively trapped in portions up to the dynamic dampers 170 and 171.

Also in the seventh embodiment, the support member 162 and the piezoelectric resonator 163 are formed by an integral member, whereby it is possible to simplify the manufacturing steps and improve sealing performance in formation of a piezoelectric resonance component, similarly to the fifth embodiment.

Figure 23:
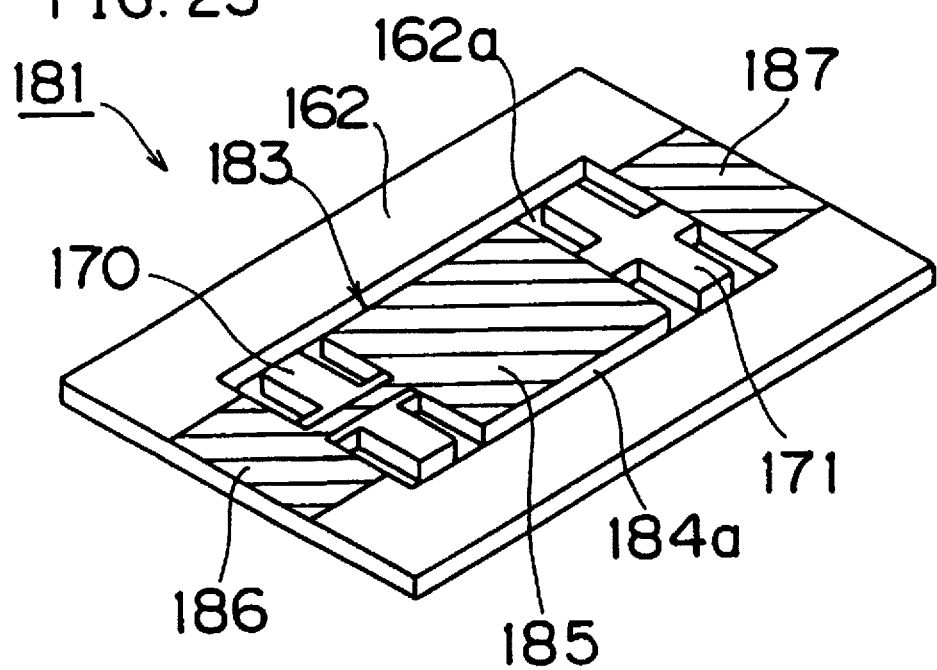
FIG. 23 is a perspective view showing an element plate which is employed in an eighth embodiment of the present invention.

FIG. 23 is a perspective view showing an element plate 181 which is employed in the eighth embodiment. This element plate 181 is formed substantially similarly to the element plate 161 in the seventh embodiment, except a resonance part of a piezoelectric resonator 183 which is arranged in an opening 162a of a support member 162. The resonance part, provided with a rectangular piezoelectric ceramic plate part 184a which is uniformly polarized along its thickness, is formed by providing resonance electrodes 185 entirely over both major surfaces of the piezoelectric ceramic plate part 184a (the resonance electrode provided on the lower side is not shown in FIG. 23). The upper resonance electrode 185 is electrically connected to a first terminal electrode 186 by a lead conductive part.

The lower resonance electrode is also electrically connected to a second terminal electrode (not shown) provided on the lower surface by another lead conductive part. The second terminal electrode is formed on a position opposed to a dummy electrode 187 which is formed on the upper surface.

Other points of this embodiment are similar to those of the seventh embodiment, and hence identical portions are denoted by the same reference numerals, to omit redundant description.

Also in this embodiment, the piezoelectric resonator 183 and the support member 162 are formed by an integral member, whereby it is possible to simplify the manufacturing steps and improve sealing performance. Further, vibrational energy in the aforementioned width expansion vibration mode is trapped in portions up to the dynamic dampers 170 and 171. Thus, the piezoelectric resonator 163 according to the eighth embodiment is formed as an energy trap piezoelectric resonator.

Figure 24:
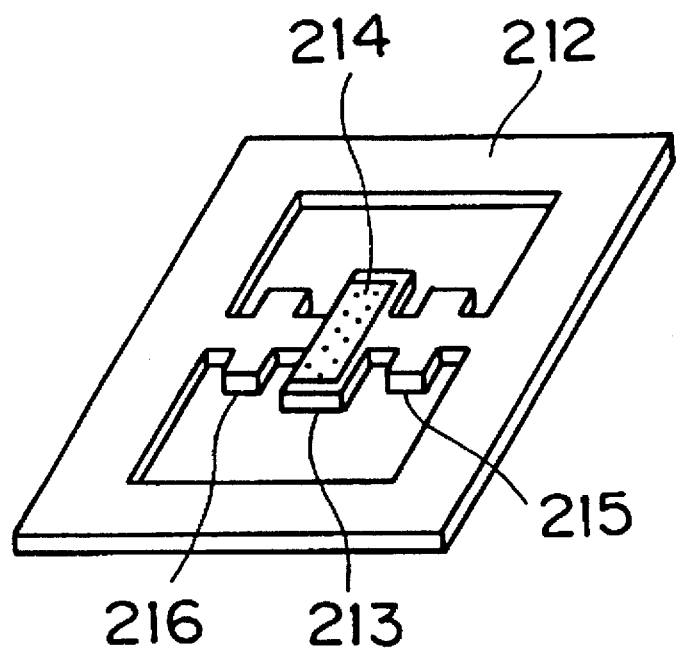
FIG. 24 is a perspective view showing an element plate which is formed by applying a piezoelectric thin film onto a metal plate.

While a rectangular piezoelectric ceramic plate is so that it is possible to work a portion forming the support member and the piezoelectric resonator by laser beam machining or etching in each of the fifth to eighth embodiments, this portion can alternatively be formed by another method. For example, a rectangular metal plate may be prepared and punched or etched to have a rectangular frame type support member 212 and a portion 213 forming a piezoelectric resonator as shown in FIG. 24, so that a piezoelectric thin film 214 is applied onto an upper surface of the portion 213 forming a piezoelectric resonator and a resonance electrode (not shown) is further formed on an upper surface of the piezoelectric thin film 214. In this case, the portion 213 of a metal plate forming a piezoelectric resonator can also serve as a resonance electrode provided on a lower surface of the piezoelectric thin film 214.

As to the resonance electrode which is formed on the upper surface of the piezoelectric thin film 214, an insulating layer may be formed in a portion passing through the support member 212 and dynamic dampers 215 and 216, so that a lead conductive part and a terminal electrode are formed on the insulating layer.

The example shown in FIG. 24, which is a modification of the fifth embodiment, can also be formed similarly in each of the sixth to eighth embodiments. Further, the metal plate may be replaced by a plate of a semiconductor material. In addition, the piezoelectric thin film may be made of piezoelectric ceramics or a piezoelectric single crystal.

Figure 25A:
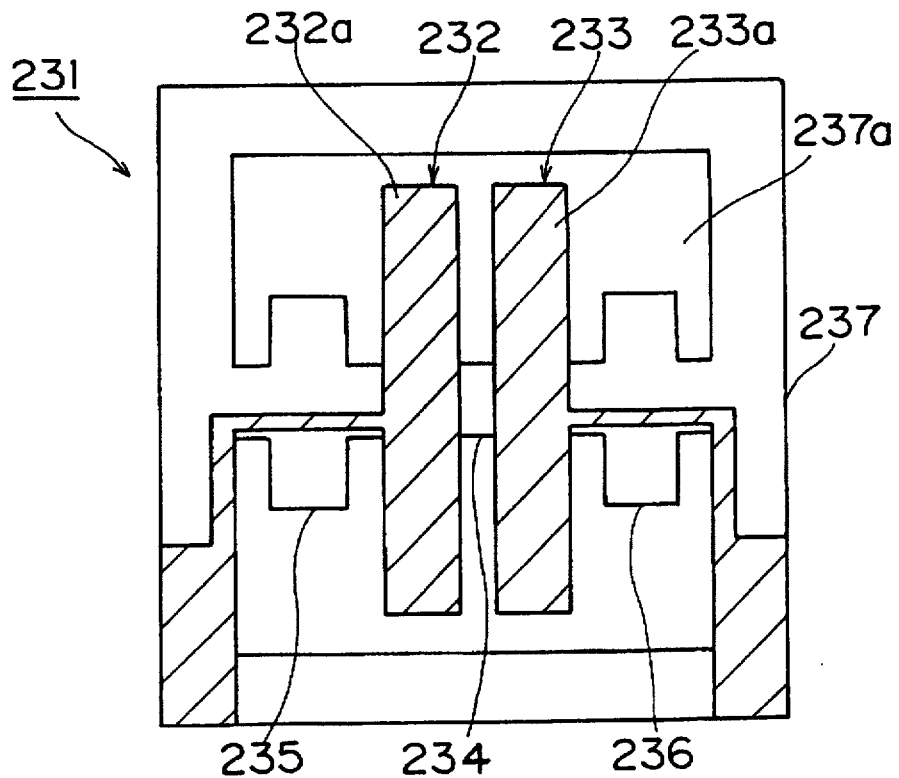
FIGS. 25A and 25B are a plan view for illustrating an element plate which is employed in a ninth embodiment of the present invention and a typical plan view showing shapes of lower electrodes through a piezoelectric ceramic plate.
Figure 25B:
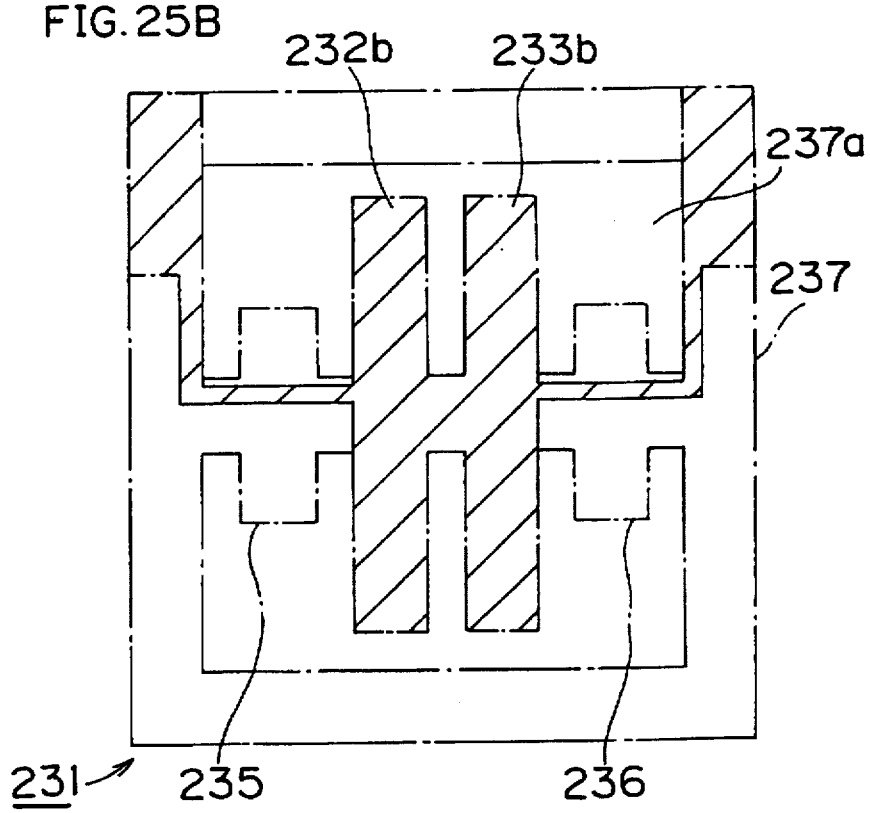

FIGS. 25A and 25B are a plan view of an element plate which is employed in the ninth embodiment of the present invention and a typical plan view showing shapes of lower electrodes through a piezoelectric plate, respectively.

The element plate 231 employed in this embodiment, which is adapted to form a double mode piezoelectric filter, has first and second piezoelectric resonance units 232 and 233 utilizing a length vibration mode. The piezoelectric resonance units 232 and 233 comprise elongated rectangular piezoelectric ceramic plate parts uniformly polarized along thicknesses thereof, which are provided with electrodes 232a and 233a for forming resonance electrodes and electrodes 232b and 233b serving as earth electrodes on first major surfaces and lower surfaces respectively.

While the first and second piezoelectric resonance units 232 and 233 are excited in a length vibration mode, nodal points of the vibration are coupled with each other by a coupling member 234. On the lower surfaces, the electrodes 232b and 233b are electrically interconnected with each other by a connecting conductive part which is formed on a lower surface of the coupling member 234. Therefore, it is possible to form a double mode piezoelectric filter utilizing symmetrical and asymmetrical modes by employing the electrode 232a or 233a as an input or output electrode while employing the electrodes 232b and 233b as earth electrodes.

This embodiment is characterized in the use of the two piezoelectric resonance units 232 and 233, and other points thereof are similar to those of the element plate according to the fifth embodiment. Namely, dynamic dampers 235 and 236 resonating in a bending mode are formed outside the first and second piezoelectric resonance units 232 and 233 through vibration transmitting parts, respectively, and outer ends of the dynamic dampers 235 and 236 are coupled to a rectangular frame type support member 237 through coupling bars. Thus, the first and second piezoelectric resonance units 232 and 233 and the like are arranged in an opening 237a of the rectangular frame type support member 237.

Further, the first and second piezoelectric resonance units 232 and 233 and the like which are arranged in the opening 237a are integrally formed with the support member 237. Namely, a single piezoelectric ceramic plate is machined or etched to obtain an integral member having the plane shape as illustrated.

While a piezoelectric ceramic plate is employed in each of the fifth to ninth embodiments, a piezoelectric single-crystalline plate may be employed in place of the piezoelectric ceramic plate.

Figure 26:
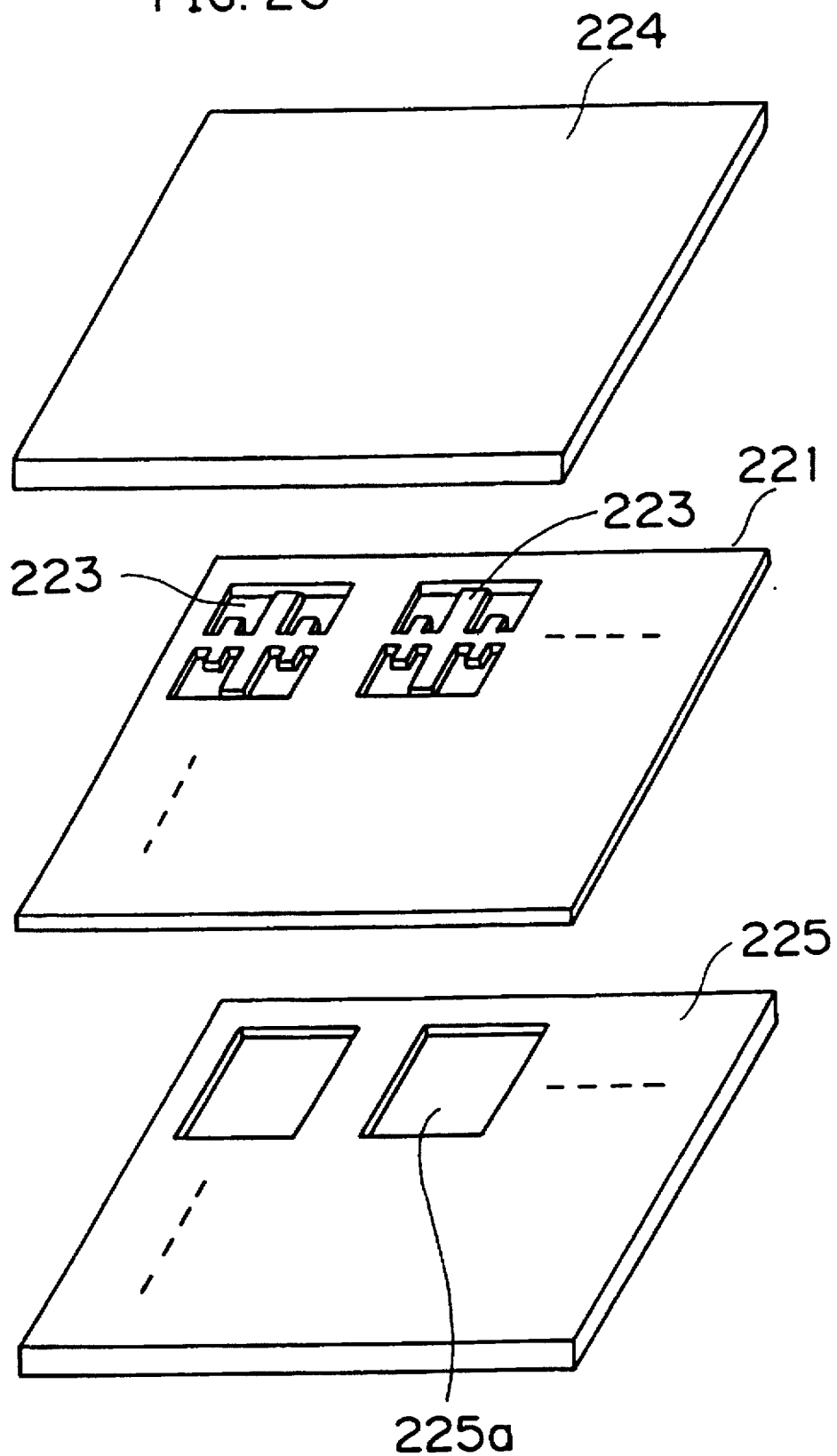
FIG. 26 is an exploded perspective view for illustrating a method of manufacturing a chip-type piezoelectric resonance component which is formed by a piezoelectric resonator according to the present invention.

In order to manufacture the element plate employed for each of the fifth to ninth embodiments, a mother plate 221 may be preferably employed as shown in FIG. 26. The mother plate 221 is worked by laser beam machining or etching, thereby integrally forming a plurality of piezoelectric resonance element portions 223 and rectangular frame type support members. Thereafter proper electrodes are formed on the piezoelectric resonance element portions 223 by vapor deposition, plating or sputtering, and mother case substrates 224 and 225 are further pasted onto upper and lower portions thereof, to obtain a mother piezoelectric resonance component laminate. Thereafter the mother laminate is cut along its thickness, whereby it is possible to efficiently manufacture respective chip-type piezoelectric resonance components.

Referring to FIG. 26, numeral 225a denotes concave portions, which are adapted to define cavities fop allowing vibration of piezoelectric resonance elements. When a case substrate having no such concave portions 225a is employed, cavity forming spacers may be interposed between the case substrates 224 and 225 and the plate 221, similarly to the embodiment shown in FIG. 2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip-type piezoelectric resonance component comprising:

a piezoelectric resonator having a piezoelectric resonance unit, a holding part, and a dynamic damper coupled to said holding part and being arranged to vibrate by receiving vibration propagated from said piezoelectric resonance unit, said dynamic damper having a shape such that a natural vibration frequency of the dynamic damper is substantially identical to a resonance frequency of said piezoelectric resonance unit, said dynamic damper being arranged so as to vibrate in a bending mode, the dynamic damper being elongated in a length direction, the dynamic damper being disposed adjacent the resonance unit in a predetermined direction, the length direction being substantially perpendicular to the predetermined direction;

a spacer plate connected to said holding part of said piezoelectric resonator, and arranged to enclose a vibrating part of said piezoelectric resonator, the vibrating part comprising at least the resonance unit and said dynamic damper;

said piezoelectric resonator and spacer plate comprising an element plate:

first and second case members fixed so as to hold the element plate formed by said piezoelectric resonator and said spacer plate; and further wherein spaces are defined between said first and second case members and said vibrating part of said piezoelectric resonator for allowing vibration of said vibrating part of said piezoelectric resonator;

said dynamic damper vibrating in a bending mode in said spaces, the dynamic damper acting as a trap to suppress oscillations propagated by said resonance unit to thereby trap the oscillations in the resonance unit.

2. A chip-type piezoelectric resonance component in accordance with claim 1, wherein said piezoelectric resonator includes first and second dynamic dampers coupled to both sides of said piezoelectric resonance unit, and first and second holding parts coupled to said first and second dynamic dampers, respectively.

3. A chip-type piezoelectric component in accordance with claim 1, wherein said piezoelectric resonance unit has a piezoelectric layer, and first and second resonance electrodes are provided on said piezoelectric layer for making same piezoelectric resonance unit resonate, said holding part being provided with first and second terminal electrodes are electrically connected with said first and second resonance electrodes, respectively.

4. A chip-type piezoelectric resonance component in accordance with claim 2, wherein said spacer plate has first and second spacer plates, said first spacer plate being bonded to first ends of said first and second holding parts of said piezoelectric resonator and said second spacer plate being bonded to second ends of said first and second holding parts thereby defining an opening in a region formed by said first and second spacer plates and said first and second holding parts, said piezoelectric resonance unit and said dynamic damper being arranged in said opening.

5. A chip-type piezoelectric resonance component in accordance with claim 1, further comprising space forming means located between said element plate and said first and second case members for forming said spaces for allowing vibration of said vibrating part of said piezoelectric resonator.

6. A chip-type piezoelectric resonance component in accordance with claim 5, wherein said space forming means is formed by a frame member having an opening.

7. A chip-type piezoelectric resonance component in accordance with claim 6, wherein said frame member has an opening formed by an adhesive.

8. A chip-type piezoelectric resonance component in accordance with claim 2, wherein said piezoelectric resonance unit comprises an elongated rectangular piezoelectric plate body and being formed to vibrate in a length vibration mode.

9. A chip-type piezoelectric resonance component in accordance with claim 2, wherein said piezoelectric resonance unit comprises a piezoelectric plate having a square plane shade and being formed to vibrate in an expansion vibration mode.

10. A chip-type piezoelectric resonance component in accordance with claim 2, wherein said piezoelectric resonance unit comprises a piezoelectric plate having a rectangular plane shape and being formed to vibrate in a width expansion vibration mode.

11. A chip-type piezoelectric resonance component in accordance with claim 2, wherein said piezoelectric resonance unit comprises a piezoelectric body being formed to vibrate in a shear mode.

12. A chip-type piezoelectric resonance component in accordance with claim 2, including a plurality of said piezoelectric resonance units, forming a chip-type piezoelectric filter.

13. A chip-type piezoelectric resonance component in accordance with claim 4, wherein said piezoelectric resonator and said first and second spacer plates are formed by an integral member.

14. A chip-type piezoelectric resonance component in accordance with claim 13, further comprising space forming means located between said element plate and said first and second case members for forming said spaces for allowing vibration of said vibrating part of said piezoelectric resonator.

15. A chip-type piezoelectric resonance component in accordance with claim 14, wherein said space forming means is formed by a frame member having an opening.

16. A chip-type piezoelectric resonance component in accordance with claim 15, wherein said frame member includes an opening formed by an adhesive.

17. A chip-type piezoelectric resonance component in accordance with claim 14, wherein said piezoelectric resonance unit comprises an elongated rectangular piezoelectric plate body and being formed to vibrate in a length vibration mode.

18. A chip-type piezoelectric resonance component in accordance with claim 14, wherein said piezoelectric resonance unit comprises a piezoelectric plate having a square plane shape and being formed to vibrate in an expansion vibration mode.

19. A chip-type piezoelectric resonance component in accordance with claim 14, wherein said piezoelectric resonance unit comprises a piezoelectric plate having a rectangular plane shape and being formed to vibrate in a width expansion vibration mode.

20. A chip-type piezoelectric resonance component in accordance with claim 2, wherein said piezoelectric resonance unit comprises a piezoelectric body being formed to vibrate in a shear mode.

21. A chip-type piezoelectric resonance component in accordance with claim 14, including a plurality of said piezoelectric resonance units forming a chip-type piezoelectric filter.

22. A chip-type piezoelectric resonance component comprising:
- a) a piezoelectric resonator including:
  1) a piezoelectric resonance unit;
  2) a holding part coupled to said piezoelectric resonance unit; and
  3) a dynamic damper coupled to said holding part to receive vibration output from said piezoelectric resonance unit, said dynamic damper having a natural vibration frequency that is substantially identical to a resonance frequency of said piezoelectric resonance unit, said dynamic damper being arranged so as to vibrate in a bending mode, the dynamic damper being elongated in a length direction, the dynamic damper being disposed adjacent the resonance unit in a predetermined direction, the length direction being substantially perpendicular to the predetermined direction;
- b) a spacer plate connected to said holding part of said piezoelectric resonator and arranged to cover a vibrating part of said piezoelectric resonator, the vibrating part comprising at least the resonance unit and said dynamic damper; and
- c) at least one case member connected to at least said spacer plate so as to hold a unit including said piezoelectric resonator and said spacer plate, a space being defined between the case member and the vibrating part;

said dynamic damper vibrating in a bending mode in said space, the dynamic damper acting as a trap to suppress oscillations propagated by said resonance unit to thereby trap the oscillations in the resonance unit.

* * * * *